United States Patent [19]
Kondo et al.

[11] Patent Number: 5,762,754
[45] Date of Patent: Jun. 9, 1998

[54] ELECTRONIC-COMPONENT SUPPLYING CARTRIDGE AND ELECTRONIC-COMPONENT SUPPLYING AND PICKING-UP APPARATUS

[75] Inventors: Yoshiyuki Kondo; Tokiyuki Kuno, both of Nagoya; Yasuo Muto, Chiryu; Mamoru Tsuda, Okazaki, all of Japan

[73] Assignee: Fuji Machine Mfg. Co., Ltd., Aichi-ken, Japan

[21] Appl. No.: 816,967

[22] Filed: Mar. 13, 1997

Related U.S. Application Data

[62] Division of Ser. No. 496,660, Jun. 29, 1995, Pat. No. 5,695,309.

[30] Foreign Application Priority Data

Jul. 4, 1994 [JP] Japan .................... 6-152344

[51] Int. Cl.⁶ .................... B65H 5/08
[52] U.S. Cl. .................... 156/584; 156/344; 414/411; 414/416; 221/25; 221/87
[58] Field of Search .................... 156/344, 584; 414/411, 416, 425; 221/25, 72, 79, 87; 226/8, 120

[56] References Cited

U.S. PATENT DOCUMENTS

| | | | |
|---|---|---|---|
| 4,440,355 | 4/1984 | Mori et al. | |
| 4,586,670 | 5/1986 | Vancelette et al. | 226/120 X |
| 4,740,136 | 4/1988 | Asai et al. | 414/787 |
| 4,820,369 | 4/1989 | Kubo | 156/344 |
| 5,020,959 | 6/1991 | Soth | 221/25 X |
| 5,116,454 | 5/1992 | Kurihara | 156/584 |
| 5,299,902 | 4/1994 | Fujiwara et al. | 414/416 |
| 5,310,301 | 5/1994 | Aono | 414/411 X |
| 5,342,474 | 8/1994 | Mohara et al. | 156/584 |
| 5,419,802 | 5/1995 | Nakatsuka et al. | 414/416 X |
| 5,492,593 | 2/1996 | Ariga et al. | 156/344 X |
| 5,531,859 | 7/1996 | Lee et al. | 414/411 X |
| 5,553,376 | 9/1996 | Solanki et al. | 29/740 X |

FOREIGN PATENT DOCUMENTS

| | | | |
|---|---|---|---|
| A-0013979 | 6/1980 | European Pat. Off. | |
| A-61-229717 | 10/1996 | Japan | 414/411 |

Primary Examiner—Mark A. Osele
Attorney, Agent, or Firm—Oliff & Berridge, PLC

[57] ABSTRACT

An electronic-component supplying cartridge is provided which includes a movable and an immovable jumping-out-preventing member and is free from jumping of electronic components out of electronic-component accommodating pockets, changing of posture of the components, or standing-up of the components due to suction. A shutter 210 is attached to a cover 82 fixed to a cartridge frame, such that the shutter 210 is movable relative to the cover 82 in the tape feeding direction. The shutter 210 includes a connection portion 214 having a groove 222 opening at a downstream-side end thereof as seen in the feeding direction, and a pair of movable jumping-out-preventing strips 228. When the shutter 210 is moved to a second position thereof, the strips 228 are received in receiving recesses 200, respectively. When a component carrier tape is fed, the shutter 210 is moved to a first position thereof where the strips 228 cover a component accommodating pocket fed to an electronic-component picking-up position. A component-suction nozzle is moved downward in synchronism with the retracting movement of the shutter 210 to the second position, so that the nozzle holds by suction an electronic component through the groove 222 before completion of the retracting movement of the shutter 210. Since the component is not freed before being held by the nozzle, the component does not jump out of the carrier tape.

19 Claims, 19 Drawing Sheets ic supplying cartridge, and
ELECTRONIC-COMPONENT SUPPLYING CARTRIDGE AND ELECTRONIC-COMPONENT SUPPLYING AND PICKING-UP APPARATUS This is a division of application Ser. No. 08/496,660 filed Jun. 29, 1995 now U.S. Pat. No. 5,695,309.

BACKGROUND OF THE INVENTION

1. Field of the Invention

The present invention relates to an electronic-component supplying cartridge which supplies an electronic-component carrier tape carrying electronic components, and an electronic-component supplying and picking-up apparatus including an electronic-component supplying cartridge, and particularly to the art of preventing the jumping of an electronic component out of an electronic-component accommodating pocket, the changing of posture of the component, or the failure to pick up the component.

2. Related Art Statement

A carrier tape carrying electronic components is covered by a cover film. For example, electronic components are accommodated in electronic-component accommodating pockets formed at a predetermined pitch in the carrier tape, and respective openings of the pockets are covered by the cover film adhered to the carrier tape. Thus, the components are prevented from jumping out of the pockets when the carrier tape is fed forward.

There is known a carrier tape which includes a pair of side portions to be supported by a cartridge, and an electronic-component accommodating portion provided between the two side portions and projecting downward from the side portions. The electronic-component accommodating portion may be provided by a longitudinally continuous projecting portion which projects downward from the side portions, continuously extends in a longitudinal direction of the carrier tape, and has a number of upwardly opening, electronic-component accommodating pockets formed at a predetermined pitch. In this case, electronic components are accommodated in the electronic-component accommodating pockets, respectively. Alternatively, the electronic-component accommodating portion may be provided by a number of container-like electronic-component accommodating portions which project downward at a predetermined pitch from the side portions extending in a longitudinal direction of the carrier tape. In the latter case, electronic components are accommodated in electronic-component accommodating pockets formed in the container-like electronic-component accommodating portions, respectively. In either case, the respective openings of the component accommodating pockets are covered by a cover film adhered to the carrier tape.

There is known an electronic-component supplying cartridge for supplying an electronic-component carrier tape carrying electronic components. The cartridge includes (a) a cartridge frame, (b) a tape feeding device which is mounted on the cartridge frame and which feeds an electronic-component carrier tape having a plurality of electronic-component accommodating pockets at a predetermined pitch, in a direction of an array of the pockets, (c) a movable jumping-out-preventing member which is provided on the cartridge frame such that the movable jumping-out-preventing member is movable relative to the cartridge frame in a direction parallel to the tape feeding direction and which has a movable jumping-out-preventing surface for preventing at least one first electronic component from jumping out of at least one first pocket of the pockets of the carrier tape, (d) an immovable jumping-out-preventing member which is provided on the cartridge frame such that the immovable jumping-out-preventing member is immovable relative to the cartridge frame, on an upstream side of the movable jumping-out-preventing member in the tape feeding direction, and which has an immovable jumping-out-preventing surface for preventing at least one second electronic component from jumping out of at least one second pocket of the carrier tape, the immovable jumping-out-preventing surface being substantially flush with the movable jumping-out-preventing surface, and (e) a movable-jumping-out-preventing-member moving device which moves the movable jumping-out-preventing member to a first position thereof right above one of the at least one first pocket fed to an electronic-component picking-up position, and retracts the movable jumping-out-preventing member from the first position thereof to a second position thereof away from the first position.

The cover film is removed from the carrier tape in the neighborhood of the electronic-component picking-up position. For preventing an electronic component from jumping out of an electronic-component accommodating pocket from which the cover film has been removed, the movable and immovable jumping-out-preventing members are employed.

In the conventional cartridge, the immovable jumping-out-preventing member is provided at a position between the electronic-component picking-up position and a position where the cover film is removed from the carrier tape, and has a length enough to cover a plurality of electronic-component accommodating pockets from which the cover film has been removed. The immovable member includes a top plate and two side plates projecting downward from opposite side edges of the top plate, and has an inverted-U-shaped cross section. The immovable member is fit on the cartridge frame and accordingly a lower surface (an inner surface) of the top plate provides the immovable jumping-out-preventing surface.

The movable jumping-out-preventing member includes a movable base portion which is attached to one of the two side plates of the immovable jumping-out-preventing member such that the movable member is movable relative to the immovable member in a direction parallel to the tape feeding direction. The movable member additionally includes a movable jumping-out-preventing planar portion extending from the movable base portion over the top plate of the immovable member. The movable jumping-out-preventing portion extends to a width-wise center of an electronic-component accommodating pocket, and is bent downward thereat through the immovable jumping-out-preventing member to provide a downwardly extending tongue whose lower end surface provides the movable jumping-out-preventing surface flush with the immovable jumping-out-preventing surface. The movable jumping-out-preventing portion has a length ensuring that even if the movable jumping-out-preventing member is moved by a maximum distance by a movable-jumping-out-preventing-member moving device, the movable jumping-out-preventing portion does not come out of the immovable jumping-out-preventing member. The immovable jumping-out-preventing member has a slit in which the downwardly extending tongue is fit.

The movable-jumping-out-preventing-member moving device moves the movable jumping-out-preventing member from the second position thereof to the first position, when the electronic-component carrier tape is fed forward, and retracts the movable member from the first position to the second position before a component-suction nozzle holds by suction an electronic component. Therefore, the leading one of the electronic components from which the cover film has been removed, is fed to the electronic-component picking-up position while being prevented from jumping out of the electronic-component accommodating pocket by the movable jumping-out-preventing member and, after the movable member is retracted to the second position thereof, the nozzle holds by suction the leading component and picks up the component from the component accommodating pocket.

Thus, the movable and immovable jumping-out-preventing members contribute to preventing the electronic components from jumping out of the electronic-component accommodating pockets and changing respective postures in the pockets. The movable jumping-out-preventing member is for preventing at least one electronic component from jumping out of at least one electronic-component accommodating pocket, and is shorter than the immovable jumping-out-preventing member. Thus, the vibration produced when the movable member is moved or the movement of the same is started or stopped, is low. In addition, a remaining portion of the movable member other than the downwardly extending tongue is located outside the immovable member, and the tongue is fit in the slit of the immovable member, so that the movable jumping-out-preventing surface as the lower surface of the tongue prevents an electronic component from jumping out of an electronic-component accommodating pocket. Since the movable surface is not held in close contact with the carrier tape, the vibration possibly produced by the movable member is not transmitted to the carrier tape.

The conventional cartridge effectively prevents the electronic components from jumping out of the electronic-component accommodating pockets or changing their their postures in the pockets because of the vibration of the carrier tape, and accordingly increases the speed of feeding of the carrier tape. Thus, the cartridge supplies each electronic component at a reduced cyclic time.

However, the movable jumping-out-preventing surface of the movable jumping-out-preventing member is opposed to a central portion of each electronic component for preventing the component from, e.g., jumping out of the component accommodating pocket. Therefore, the component-suction nozzle cannot hold by suction the component before the movable member is fully retracted from above the component.

Thus, during a time period after completion of the retracting movement of the movable jumping-out-preventing member and before the component-suction nozzle holds by suction the electronic component, the component cannot be prevented from jumping out of the component accommodating pocket or changing its posture in the pocket. Therefore, because of the vibration produced when the movable member is stopped, the component may jump out of the component accommodating pocket or change its posture in the pocket. In addition, when the nozzle contacts and holds the component, the component may stand upright because of the suction of the nozzle. In either case, the nozzle may fail to hold the component with accuracy.

SUMMARY OF THE INVENTION

It is therefore an object of the present invention to provide an electronic-component supplying cartridge which includes an immovable and a movable jumping-out-preventing member and more effectively prevents electronic components from jumping out of electronic-component accommodating pockets, changing their postures in the pockets, or standing up in the pockets, and an electronic-component supplying and picking-up apparatus which includes an electronic-component supplying cartridge and a component-suction nozzle for holding without any errors each electronic component supplied by the cartridge.

The above object may be achieved according to a first aspect of the present invention, which provides an electronic-component supplying cartridge including (a) a cartridge frame, (b) a tape feeding device, (c) a movable jumping-out-preventing member, (d) an immovable jumping-out-preventing member, and (e) a movable-jumping-out-preventing-member moving device, wherein the movable jumping-out-preventing member has a groove which extends in the tape feeding direction and opens at one end thereof, and a pair of movable jumping-out-preventing surfaces which extend in the tape feeding direction on both sides of the groove, respectively.

In the electronic-component supplying cartridge constructed as described above, it is not required that the movable jumping-out-preventing surfaces be strictly flush with the immovable jumping-out-preventing surface. Otherwise, the movable surfaces and the immovable surface may be substantially flush with each other. For example, although electronic components which are fed while being prevented from jumping out of electronic-component accommodating pockets by the immovable jumping-out-preventing member may be jammed with the movable jumping-out-preventing member, this jamming can be avoided by employing movable jumping-out-preventing surfaces slightly retracted from the level of the immovable jumping-out-preventing surface. Alternatively, for avoiding the jamming, it is possible to employ movable jumping-out-preventing surfaces whose edges are rounded and which are slightly projected from the level of the immovable jumping-out-preventing surface.

In the present electronic-component supplying cartridge, each electronic component is covered by the pair of movable jumping-out-preventing surfaces of the movable jumping-out-preventing member, while the component carrier tape is fed and at the time when the component is positioned at the electronic-component picking-up position. Thus, the component is effectively prevented from jumping out of the electronic-component accommodating pocket, changing its posture in the pocket, or standing up in the pocket.

While each electronic component is fed from a position where the cover film is removed from the component accommodating pocket in which the component is accommodated, to the electronic-component picking-up position, the component is continuously covered by one or both of the immovable jumping-out-preventing surface and the movable jumping-out-preventing surfaces. At the picking-up position, each component is covered by the movable jumping-out-preventing surfaces. A component-suction nozzle is moved through the groove formed between the two movable jumping-out-preventing surfaces, and holds by suction the component. After the movable jumping-out-preventing surfaces have been moved to the second position of the movable member and accordingly the opening of the component accommodating pocket has been freed, the nozzle picks up the component from the pocket.

The groove which extends in the tape feeding direction opens at one of opposite ends thereof which one end leads the other end when the movable jumping-out-preventing member is moved from the second position thereof to the first position. Thus, the movable jumping-out-preventing member can be moved between the first and second positions while the component-suction nozzle contacts and holds the electronic component.

The freeing of the component accommodating pocket means that in the state in which the movable jumping-out-preventing member has been retracted to the second position thereof, a space wide enough to permit the electronic component to be picked out therethrough from the component accommodating pocket, is provided at the electronic-component picking-up position of the electronic-component supplying cartridge. This space may be provided by not connecting between respective portions of the movable member defining the pair of movable jumping-out-preventing surfaces, at respective ends of those portions which are nearer to the picking-up position when the movable member is positioned at the second position thereof. Alternatively, the space may be provided by forming an opening communicating with an end of the groove which is nearer to the picking-up position when the movable member is positioned at the second position.

Thus, in the present invention, each electronic component is prevented from being freed, by at least one of the immovable jumping-out-preventing surface, the movable jumping-out-preventing surfaces, and the component-suction nozzle, after the cover film is removed. Thus, the component is prevented from jumping out of the component accommodating pocket or changing its posture in the pocket, even if vibration may be produced when the feeding of the component carrier tape is started or ended or when the movement of the movable member is started or ended. In addition, the component is prevented from standing upright because of the suction of the nozzle. Thus, the present cartridge can supply the electronic components with accuracy. The cartridge enjoys the advantages with the immovable and movable jumping-out-preventing members and simultaneously prevents each component from standing up when the component is picked up by the component-suction nozzle.

In an embodiment of the cartridge in accordance with the invention, the second position of the movable jumping-out-preventing member is on an upstream side of the electronic-component picking-up position in the tape feeding direction, and the groove of the movable jumping-out-preventing member opens at the one end thereof on a downstream side thereof in the tape feeding direction.

In the above embodiment, the movable jumping-out-preventing surfaces of the movable jumping-out-preventing member positioned at the first position thereof may cooperate with the immovable jumping-out-preventing surface to provide a continuous jumping-out-preventing surface. In the last case, it is possible to move the movable member to the first position thereof simultaneously with a feeding of the component carrier tape, or before a feeding of the carrier tape.

In the case where a discontinuity is produced between the movable jumping-out-preventing surfaces and the immovable jumping-out-preventing surface when the movable jumping-out-preventing member is moved to the first position thereof, it is preferred that the movable member be moved to the first position thereof simultaneously with a feeding of the component carrier tape.

In this embodiment, the movable jumping-out-preventing member may be provided to overlap the immovable jumping-out-preventing member, thereby contributing to reducing a dimension of the cartridge in the tape feeding direction.

In another embodiment of the cartridge in accordance with the invention, the second position of the movable jumping-out-preventing member is on a downstream side of the electronic-component picking-up position in the tape feeding direction, and the groove of the movable jumping-out-preventing member opens at the one end thereof on an upstream side thereof in the tape feeding direction.

In the above embodiment, the movable jumping-out-preventing member is moved to the first position thereof before a feeding of the component carrier tape. It is preferred that the movable jumping-out-preventing surfaces of the movable jumping-out-preventing member positioned at the first position thereof cooperate with the immovable jumping-out-preventing surface to provide a continuous jumping-out-preventing surface. Alternatively, the movable surfaces of the movable member positioned at the first position thereof may be apart from the immovable surface, by a distance smaller than a dimension of the electronic components as seen in the tape feeding direction.

In another embodiment of the cartridge in accordance with the invention, the immovable jumping-out-preventing surface of the immovable jumping-out-preventing member is provided adjacent to the pair of movable jumping-out-preventing surfaces of the movable jumping-out-preventing member positioned at the second position thereof, on an upstream side of the pair of movable jumping-out-preventing surfaces in the tape feeding direction.

In another embodiment of the cartridge in accordance with the invention, the immovable jumping-out-preventing member includes a cover which includes a top plate and a pair of side plates extending downward from opposite side edges of the top plate and has an inverted-U-shaped cross section and which covers the carrier tape supported on the cartridge frame and prevents the carrier tape from jumping up from the cartridge frame, the immovable jumping-out-preventing surface including a lower surface of the top plate of the cover which surface faces the carrier tape.

In the above embodiment, the side plates of the cover contact longitudinally extending side ends of the electronic-component carrier tape, respectively, thereby preventing the carrier tape from being rotated about an axis line perpendicular to the tape feeding direction.

In another embodiment of the cartridge in accordance with the invention, the cover has a length extending from an upstream side of the electronic-component picking-up position in the tape feeding direction, to a downstream side of the picking-up position, and has an opening formed in at least a portion thereof directly above the one first pocket fed to the picking-up position, the opening being formed through a thickness of the portion of the cover, the cover having, on a downstream side of the opening in the tape feeding direction, a jumping-up preventing portion for preventing the carrier tape from jumping up from the cartridge frame.

In the case where the second position of the movable jumping-out-preventing member is positioned on the upstream side of the electronic-component picking-up position in the tape feeding direction, the opening of the cover may be formed in just a first portion thereof directly above the component accommodating pocket fed to the picking-up position. Meanwhile, in the case where the second position of the movable member is positioned on the downstream side of the picking-up position, the opening of the cover may be formed in the first portion thereof and a second portion thereof adjacent to the first portion on a downstream side of the first portion in the tape feeding direction. In the latter case, the movable jumping-out-preventing surfaces are positioned within the opening of the cover.

In another embodiment of the cartridge in accordance with the invention, while the movable jumping-out-preventing member is positioned at at least the first position thereof, the movable jumping-out-preventing surfaces are positioned within the opening of the cover.

In the above embodiment, while the movable jumping-out-preventing member is positioned at the first position thereof, only the movable jumping-out-preventing surfaces cover the electronic-component accommodating pocket fed to the picking-up position. Since only a small clearance is provided between the movable surfaces positioned within the opening of the cover, and the electronic-component carrier tape, the movable surfaces can cover the opening of the accommodating pocket.

In another embodiment of the cartridge in accordance with the invention, the movable jumping-out-preventing member includes a shutter which includes a pair of slideable portions and a connection portion connecting the slideable portions to each other and has an inverted-U-shaped cross section and which covers the cover such that the shutter is movable relative to the cover in the tape feeding direction, the connection portion of the shutter defining the groove and the pair of movable jumping-out-preventing surfaces.

In the above embodiment, the pair of slideable portions of the shutter having the inverted-U-shaped cross section are engaged with the cover, so that the slideable portions function as guide portions for guiding the movement of the shutter relative to the cover in the tape feeding direction.

In another embodiment of the cartridge in accordance with the invention, the cartridge further includes a shutter guiding device which includes an elongate hole which is formed in one of the pair of slideable portions of the shutter and the pair of side plates of the cover and which extends parallel to the tape feeding direction, and a guide pin which projects from the other of the pair of slideable portions and the pair of side plates and which extends through the elongate hole, the shutter guiding device guiding the movement of the shutter relative to the cover based on the relative movement of the elongate hole and the guide pin.

In another embodiment of the cartridge in accordance with the invention, the immovable jumping-out-preventing member includes a pair of receiving portions which extend in the tape feeding direction and open at least in the immovable jumping-out-preventing surface and on a side of the electronic-component picking-up position, and has the immovable jumping-out-preventing surface located between the receiving portions, the movable jumping-out-preventing member including a pair of movable jumping-out-preventing portions which are receiveable in the pair of receiving portions, respectively, and have the movable jumping-out-preventing surfaces, respectively, the pair of movable jumping-out-preventing portions defining the groove of the movable jumping-out-preventing member.

In the above embodiment, the pair of movable jumping-out-preventing portions are received in the pair of receiving portions, at different timings, depending upon whether the second position of the movable jumping-out-preventing member is on the upstream or downstream side of the first position of the movable member in the tape feeding direction.

In the case where the second position is on the upstream side of the first position, the pair of movable jumping-out-preventing portions are received in the pair of receiving portions, at the second position where the movable jumping-out-preventing surfaces prevent the next electronic component to be fed to the picking-up position, from jumping out of the component accommodating pocket. Simultaneously with, or prior to, a feeding of the component carrier tape, the movable surfaces are moved to the first position where the movable surfaces prevent the component from standing upright because of the suction of the component-suction nozzle.

On the other hand, in the case where the second position is on the downstream side of the first position, the pair of movable jumping-out-preventing portions are received in the pair of receiving portions, at the first position where the movable jumping-out-preventing surfaces prevent the next electronic component to be fed to the picking-up position, from jumping out of the component accommodating pocket and simultaneously prevent the electronic component from standing upright because of the suction of the component-suction nozzle. After the component is held by the nozzle, the movable jumping-out-preventing member is retracted to the second position, thereby permitting the nozzle to pick up the component from the component accommodating pocket.

In this embodiment, the movable jumping-out-preventing portions are received in the pair of receiving portions, and the movable jumping-out-preventing surfaces overlap the immovable jumping-out-preventing surface in the tape feeding direction. Thus, each electronic component is more effectively prevented from jumping out of the component accommodating pocket.

In another embodiment of the cartridge in accordance with the invention, each of the pair of receiving portions of the immovable jumping-out-preventing member includes a receiving recess formed through a thickness of the immovable jumping-out-preventing member.

In the case where the receiving portions are provided by the receiving recesses formed through the thickness of the immovable member, the receiving portions are easily produced.

In another embodiment of the cartridge in accordance with the invention, the receiving recess includes a slot having a small dimension in a width-wise direction thereof perpendicular to the tape feeding direction.

In another embodiment of the cartridge in accordance with the invention, each of the pair of receiving portions of the immovable jumping-out-preventing member includes a receiving pocket opening in the immovable jumping-out-preventing surface and on a side of the electronic-component picking-up position.

In another embodiment of the cartridge in accordance with the invention, the pair of movable jumping-out-preventing portions of the movable jumping-out-preventing member include a pair of movable jumping-out-preventing planar portions which are receiveable in the receiving recesses of the immovable jumping-out-preventing member, respectively, such that the planar portions are movable relative to the receiving recesses in the tape feeding direction.

In another embodiment of the cartridge in accordance with the invention, the pair of movable jumping-out-preventing portions of the movable jumping-out-preventing member include a pair of movable jumping-out-preventing tongues having respective widths ensuring that the tongues are receiveable in the slots of the immovable jumping-out-preventing member, respectively.

In another embodiment of the cartridge in accordance with the invention, the pair of movable jumping-out-preventing portions of the movable jumping-out-preventing member include a pair of movable jumping-out-preventing planar portions which are receiveable in the receiving pockets of the immovable jumping-out-preventing member, respectively, such that the planar portions are movable relative to the receiving pockets in the tape feeding direction.

In another embodiment of the cartridge in accordance with the invention, the movable jumping-out-preventing member includes a connection portion connecting respective downstream-side ends of the pair of movable jumping-out-preventing planar portions as seen in the tape feeding direction, the connection portion including an opening formed in a part thereof which is, when the movable jumping-out-preventing member is positioned at the second position thereof, positioned right above the one first pocket fed to the electronic-component picking-up position, the opening being formed through a thickness of the part of the connecting portion, and permitting the first electronic component to be picked up therethrough from the one first pocket.

In another embodiment of the cartridge in accordance with the invention, each of the pair of movable jumping-out-preventing planar portions of the movable jumping-out-preventing member projects from the connecting portion, and has an inclined end surface facing toward the cartridge frame such that as the inclined end surface approaches the connection portion, a distance between the inclined end surface and the cartridge frame increases.

In another embodiment of the cartridge in accordance with the invention, the movable-jumping-out-preventing-member moving device includes a portion of the tape feeding device and a movable-jumping-out-preventing-member-related transmitting device which transmits a motion of the portion of the tape feeding device to the movable jumping-out-preventing member.

In the above embodiment, the movable jumping-out-preventing member is moved by utilizing the motion of the tape feeding device to feed the electronic-component carrier tape, and the movable-jumping-out-preventing-member-related transmitting device is constructed depending upon the construction of the movable jumping-out-preventing member.

For example, as will be described in the detailed description of the preferred embodiments, the movable-jumping-out-preventing-member-related transmitting device may be designed such that the movable jumping-out-preventing member is moved from the second position thereof to the first position in the same direction as the tape feeding direction simultaneously when the component carrier tape is fed forward. Alternatively, the transmitting device may be designed such that the movable member is moved from the second position to the first position in a direction opposite to the tape feeding direction at a timing different from a timing of feeding of the carrier tape.

Since, in the present embodiment, a portion of the tape feeding device is used as the movable-jumping-out-preventing-member moving device, the moving device can be produced at low cost.

In another embodiment of the cartridge in accordance with the invention, the tape feeding device includes a feeding member which is provided on the cartridge frame such that the feeding member is reciprocateable in the tape feeding direction, a driving member which is movably attached to the cartridge frame, and a transmitting member which transmits the movement of the driving member to the feeding member, the driving member being driven via a driving-member moving device by an indexing-related servomotor, the indexing-related servomotor rotating an index table which supports a plurality of component-suction nozzles each for picking up electronic components from the cartridge and which is rotatable about an axis line.

In the above embodiment, the movable-jumping-out-preventing-member moving device does not need an exclusive drive source, and accordingly the moving device can be simplified and be produced at low cost. In the case where a plurality of supplying cartridges each in accordance with the present invention are used, the respective movable-jumping-out-preventing-member moving devices of those cartridges can commonly employ a single drive source and a single driving-member moving device. In the last case, the moving devices can be simplified and be produced at low cost.

In another embodiment of the cartridge in accordance with the invention, the tape feeding device includes a drive source, a feeding member which is provided on the cartridge frame such that the feeding member is reciprocateable in the tape feeding direction, a feeding-member-related transmitting device which transmits a driving force of the drive source to the feeding member so as to reciprocate the feeding member forward and backward, and a selected-movement transmitting device which transmits the forward movement of the feeding member to the carrier tape and does not transmit the backward movement of the feeding member to the carrier tape, the movable-jumping-out-preventing-member moving device including the drive source, the feeding member, and the feeding-member-related transmitting device, the movable-jumping-out-preventing-member-related transmitting device including a first engagement portion which is provided on the feeding member, and a second engagement portion which is provided on the movable jumping-out preventing member and which is engageable with the first engagement portion to transmit the movement of the feeding member to the movable jumping-out preventing member.

In the above embodiment, each cartridge has a drive source for moving the movable jumping-out-preventing member. Therefore, the movable member can be moved at any time.

In another embodiment of the cartridge in accordance with the invention, the drive source of the tape feeding device includes a reciprocating fluid cylinder provided on the cartridge frame.

In another embodiment of the cartridge in accordance with the invention, the feeding-member-related transmitting device of the tape feeding device includes a connecting member connecting a piston rod of the reciprocating fluid cylinder and the feeding member to each other, the connecting member converting the reciprocation of the piston rod into the reciprocation of the feeding member.

In another embodiment of the cartridge in accordance with the invention, the feeding member of the tape feeding device includes a rotary member which is provided on the cartridge frame such that the rotary member is rotatable about an axis line perpendicular to the tape feeding direction, the selected-movement transmitting device including a ratchet wheel which is provided on the cartridge frame such that the ratchet wheel is rotatable about an axis line parallel to the axis line of rotation of the rotary member, a sprocket which is attached to the ratchet wheel such that the sprocket is not rotatable relative to the ratchet wheel and which has teeth engageable with perforations formed in the carrier tape, and a ratchet pawl which is attached to the rotary member and is engageable with the teeth of the ratchet wheel.

In another embodiment of the cartridge in accordance with the invention, the feeding member of the tape feeding device includes a rotary plate which is provided on the cartridge frame such that the rotary plate is rotatable, the first engagement portion including a projection projecting from one of the rotary plate and the movable jumping-out-preventing member, the second engagement portion including a recess which is provided on the other of the rotary plate and the movable jumping-out-preventing member and extends in a direction perpendicular to a direction of rotation of the rotary plate.

In another embodiment of the cartridge in accordance with the invention, the recess has a width in a direction parallel to the tape feeding direction to ensure that the projection is moved within the recess when the feeding member is moved to feed the carrier tape, and is engaged with an end of the recess, when a feeding of the carrier tape is ended, to subsequently transmit the movement of the feeding member to the movable jumping-out preventing member.

According to another aspect of the present invention, there is provided an electronic-component supplying and picking-up apparatus including (1) an electronic-component supplying cartridge in accordance with the first aspect of the invention, (2) a component-suction nozzle, and (3) a component-suction-nozzle advancing and retracting device which advances the nozzle to an electronic-component suction position and retracts the nozzle away from the suction position, the apparatus further including a synchronizing device which synchronizes respective operations of the component-suction-nozzle advancing and retracting device and the movable-jumping-out-preventing-member moving device of the cartridge such that after the nozzle holds by suction the first electronic component, the movable jumping-out preventing surfaces of the movable jumping-out preventing member are retracted away from above the first electronic component.

In the electronic-component supplying and picking-up apparatus constructed as described above, the component-suction nozzle is advanced, by the advancing and retracting device, from the retracted position thereof to the component suction position where the nozzle holds by suction the electronic component and picks up the component from the component supplying cartridge. In this process, the nozzle passes through the groove provided between the pair of movable jumping-out-preventing surfaces and contacts and holds the component accommodated in the component accommodating pocket covered by the pair of movable jumping-out-preventing surfaces. After the nozzle holds the component, the pair of movable jumping-out-preventing surfaces are retracted away from above the component and subsequently the nozzle is retracted to the retracted position thereof, so that the component is picked out from the component accommodating pocket.

In the above apparatus, the cartridge including the movable jumping-out-preventing member having the groove supplies electronic components, and the respective movements of the component-suction nozzle and the movable jumping-out-preventing member are synchronized so that the nozzle contacts and holds each electronic component which is being prevented from standing upright in the pocket, by the pair of movable jumping-out-preventing surfaces of the movable jumping-out-preventing member. Thus, the present apparatus can supply and pick up electronic components with reliability.

In an embodiment of the supplying and picking-up apparatus in accordance with the invention, the apparatus further includes an index table which supports a plurality of the component-suction nozzles and which is rotatable about an axis line, and an index-table driving device which intermittently rotates the index table based on rotation of an indexing-related servomotor, the component-suction-nozzle advancing and retracting device including a first cam which is rotated by the indexing-related servomotor, a first cam follower which follows the first cam, and a component-suction-nozzle-related transmitting device which converts the motion of the first cam follower into the advancing movement of each of the component-suction nozzles to the electronic-component suction position and the retracting movement of the each nozzle away from the suction position, the tape feeding device including the feeding member, the selected-movement transmitting device, and a feeding-member-related transmitting device which includes the driving member, a second cam which is rotated by the indexing-related servomotor, a second cam follower which follows the second cam, a driving-member moving device which moves the driving member based on the motion of the second cam follower, and a transmitting member which transmits the movement of the drive member to the feeding member, the movable-jumping-out-preventing-member moving device including a movable-jumping-out-preventing-member-related transmitting device which transmits the motion of the feeding member to the movable jumping-out-preventing member, the synchronizing device including a first cam surface of the first cam and a second cam surface of the second cam which surfaces ensure that after the each nozzle holds by suction the first electronic component, the movable jumping-out-preventing surfaces of the movable jumping-out-preventing member are retracted away from above the first electronic component.

In the above embodiment, the advancing and retracting movements of the component-suction nozzle between the electronic-component suction position and the retracted position is mechanically synchronized with the movements of the movable jumping-out-preventing member between the first and second positions. Thus, the present apparatus is free from, e.g., malfunctions due to electrical disorders and supplies and picks up electronic components with higher reliability.

In another embodiment of the supplying and picking-up apparatus in accordance with the invention, the apparatus further includes a component-suction-nozzle moving device which supports the component-suction nozzle and moves the nozzle to an arbitrary position on a plane perpendicular to an axis line of the nozzle, the component-suction-nozzle advancing and retracting device being provided on the component-suction-nozzle moving device so that the advancing and retracting device advances the nozzle to the electronic-component suction position and retracts the nozzle away from the suction position, the movable-jumping-out-preventing-member moving device including a drive source provided on the cartridge frame, a moving member which is provided on the cartridge frame such that the moving member is reciprocateable in the tape feeding direction and which is engageable with the movable jumping-out preventing member so as to move the movable jumping-out preventing member, and a movable-jumping-out-preventing-member-related transmitting device which transmits a driving force of the drive source to the moving member so as to reciprocate the moving member, the synchronizing device including a control device which controls the component-suction-nozzle moving device, the component-suction-nozzle advancing and retracting device, and the movable-jumping-out-preventing-member moving device.

DETAILED DESCRIPTION OF THE PREFERRED EMBODIMENTS

Hereinafter, embodiments of the present invention will be described in detail by reference to the drawings.

Figure 4:
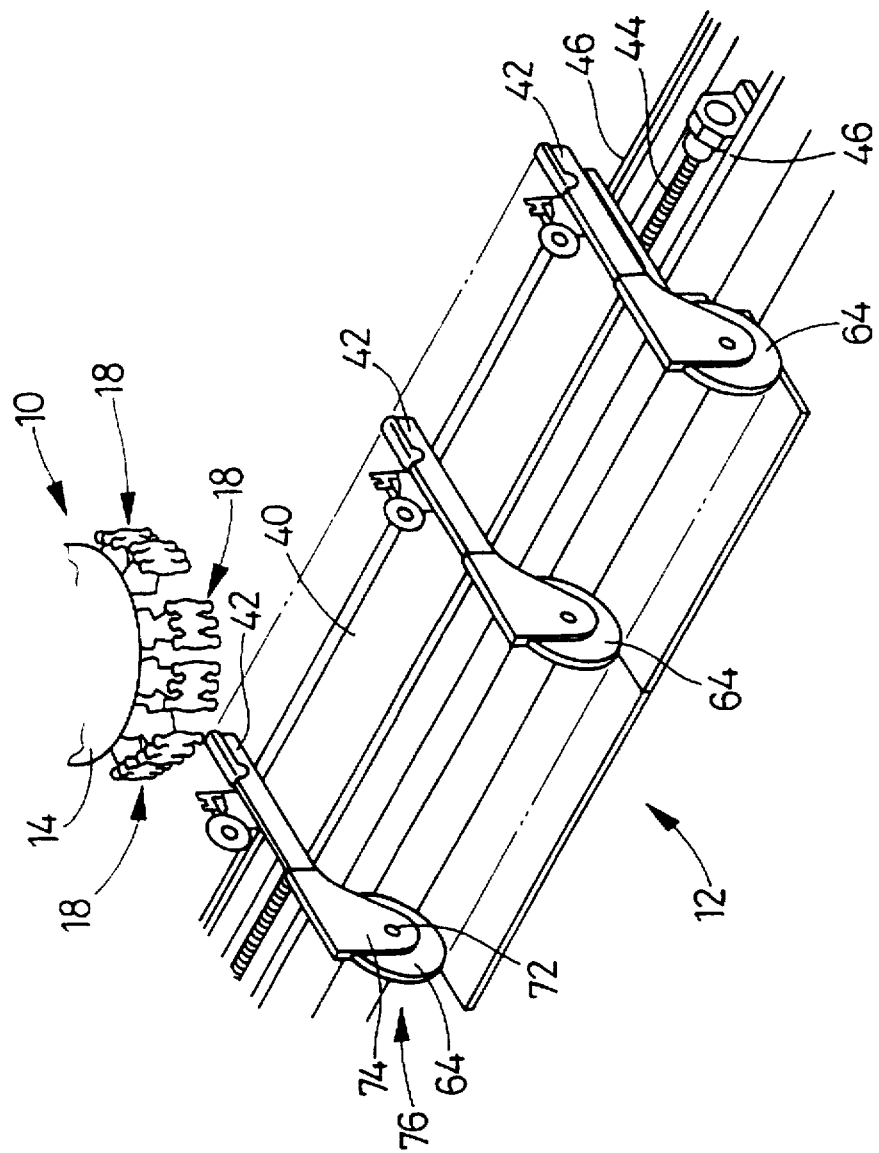
FIG. 4 is a perspective view of an electronic-component supplying apparatus including the electronic-component supplying cartridge, and an electronic-component mounting apparatus.
Figure 5:
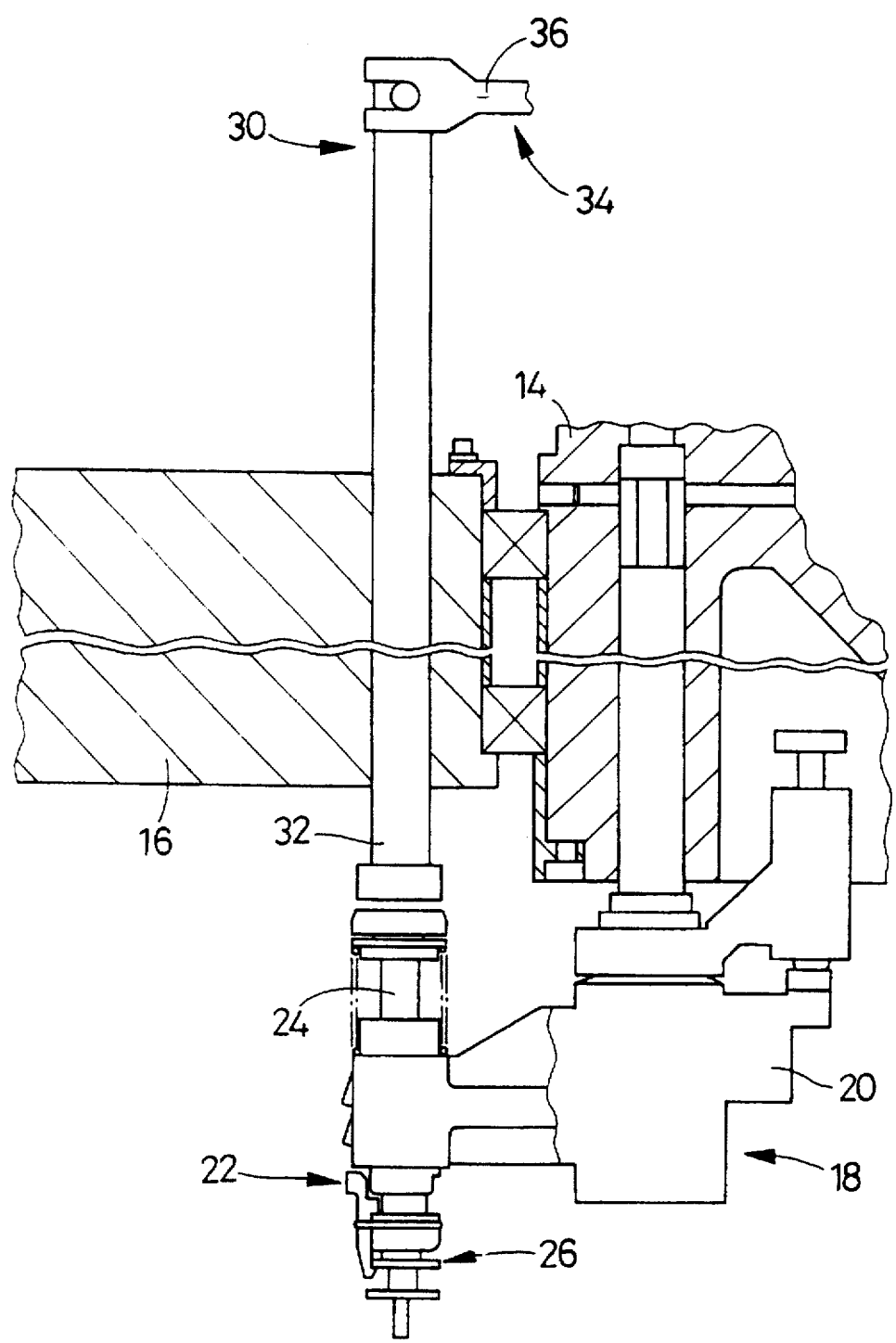
FIG. 5 is a side view (partly in cross section) of a component-suction unit and a component-suction-head elevating device of the electronic-component mounting apparatus.

In FIG. 4, reference numeral 10 designates an electronic-component mounting apparatus, and reference numeral 12 designates an electronic-component supplying apparatus. The mounting device 10 includes an index table 14 which is intermittently rotatable about a vertical axis line. As shown in FIG. 5, the index table 14 is rotatably supported by a support table 16. The index table 14 supports twelve component-suction units 18, and is intermittently rotated by an intermittent-rotation drive device (not shown) provided by a cam, a cam follower, a rotation axis member, and an index servomotor for rotating the cam, so that each of the twelve suction units 18 is sequentially moved to an electronic-component supplying position, an electronic-component-posture detecting position, an electronic-component-posture correcting position, and an electronic-component mounting position.

Each of the suction units 18 includes a unit frame 20 which is supported by the index table 14 such that the unit frame 20 is movable upward and downward. Each suction unit 18 is moved upward and downward as a roller fit in a cam groove of a fixed cylindrical cam is moved in the cam groove together with the rotation of the index table 14. As the index table 14 is rotated, each suction unit 18 is moved upward to an uppermost position thereof at the electronic-component supplying position, and is moved downward to a lowermost position thereof at the electronic-component mounting position.

Each of the twelve unit frames 20 supports three component-suction heads 22, and a selected one of the suctions heads 22 is positioned at an operative position where the selected suction head 22 holds by suction an electronic component and mounts the component. Each suction head 22 includes a holder 24 which is supported by the unit frame 20 such that the holder 24 is movable upward and downward, and a component-suction nozzle 26 secured to the suction nozzle 26. Each suction nozzle 26 holds by vacuum pressure an electronic component.

Figure 6:
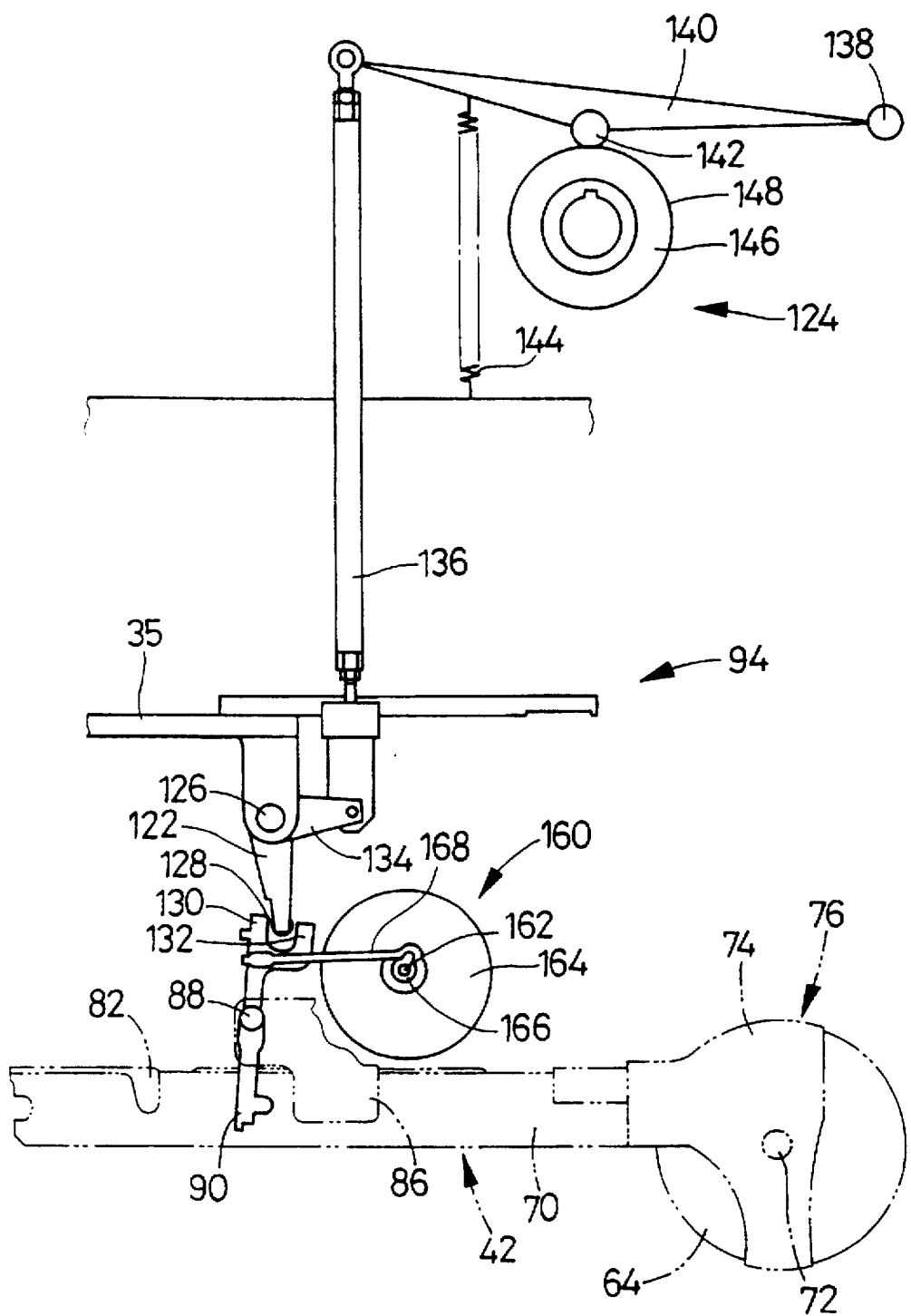
FIG. 6 is a side view of the electronic-component supplying cartridge and a driving-lever rotating device.

At the electronic-component supplying position, there is provided a component-suction-head elevating device 30. The elevating device 30 includes an elevating member 32 which is supported by the support table 16 such that the elevating member 32 is movable upward and downward, and an elevating-member driving device 34 which moves the elevating member 32 upward and downward. The driving device 34 includes a lever 36 which is rotatably attached to a frame 35 (FIG. 6). The lever 36 is engaged with an upper end of the elevating member 32 such that the lever 36 is rotatable relative to the elevating member 32. The rotation of the index servomotor is transmitted to the lever 36 via a cam, a cam follower, and a motion-transmitting mechanism (not shown), so as to rotate the lever 36 and thereby move the elevating member 32 upward and downward. Consequently the suction head 22 is moved upward and downward between an electronic-component suction position where the suction nozzle 26 sucks an electronic component, and a retracted position away from the suction position. Although not shown, a component-suction-head elevating device like the elevating device 30 is provided at the electronic-component mounting position.

The electronic-component supplying apparatus 12 is provided at the electronic-component supplying position where an X table 40 is provided such that the the X table 40 is movable, on a horizontal plane, in a direction (hereinafter, referred to as the X direction) tangential to a locus of rotation of the suction units 18 on the index table 14. The X table 40 supports a number of electronic-component supplying cartridges 42 such that respective electronic-component picking-up positions of the cartridges 42 are located on a straight line parallel to the X direction. The X table 40 is moved along guide rails 46 as a ball screw 44 is rotated by an X-direction servomotor (not shown), so that a selected one of the cartridges 42 is moved to the electronic-component supplying position.

Figure 9:
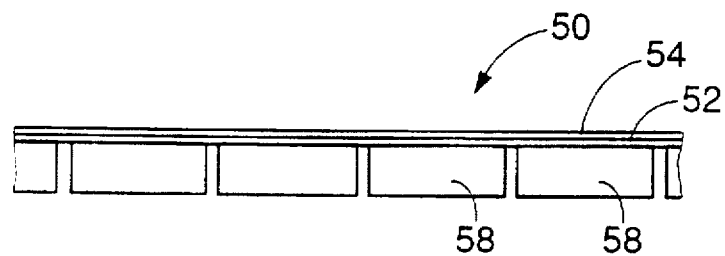
FIG. 9 is a side view of an electronic-component carrier tape supplied by the electronic-component supplying cartridge.
Figure 10:
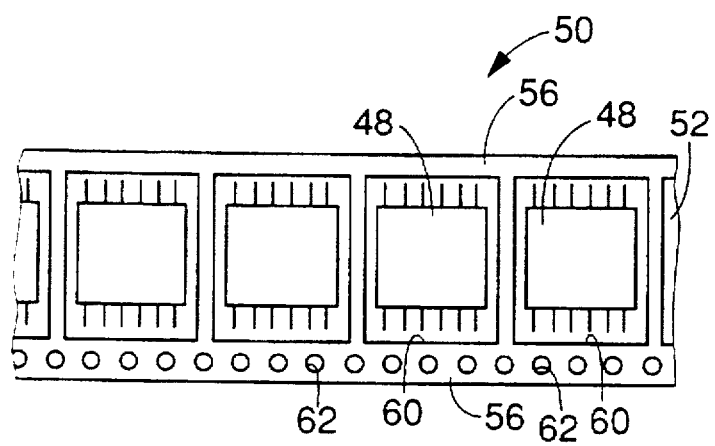
FIG. 10 is a plan view of the electronic-component carrier tape from which a cover film has been removed.
Figure 11:
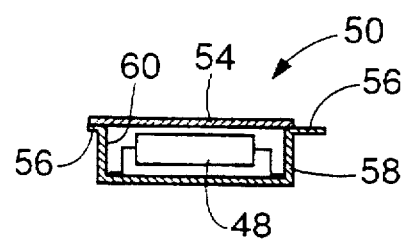
FIG. 11 is a cross-sectional side view of the electronic-component carrier tape.
Figure 12:
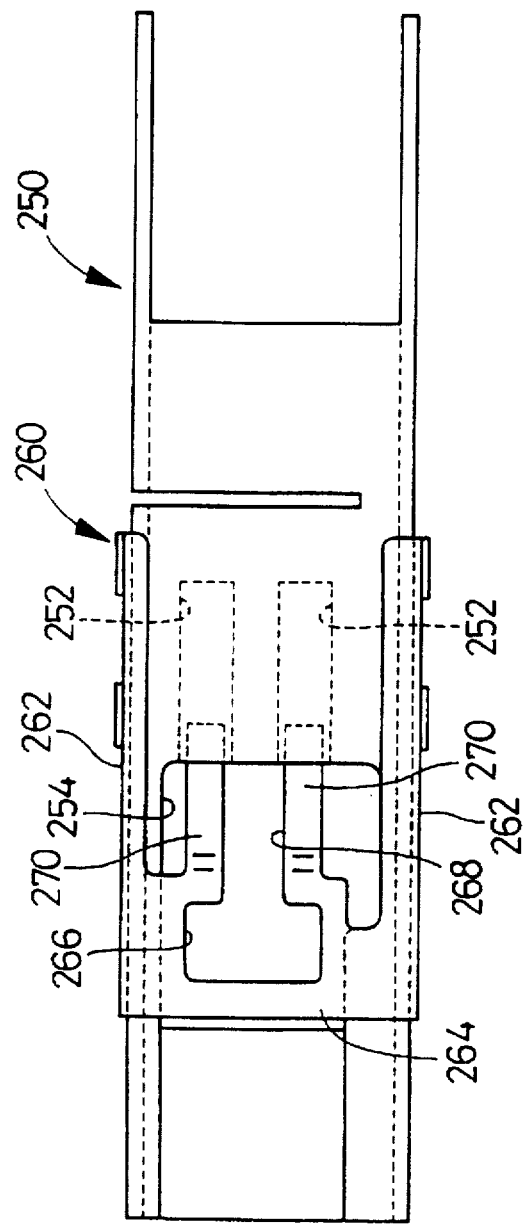
FIG. 12 is a plan view of a cover and a shutter of an electronic-component supplying cartridge as another embodiment of the present invention.
Figure 13:
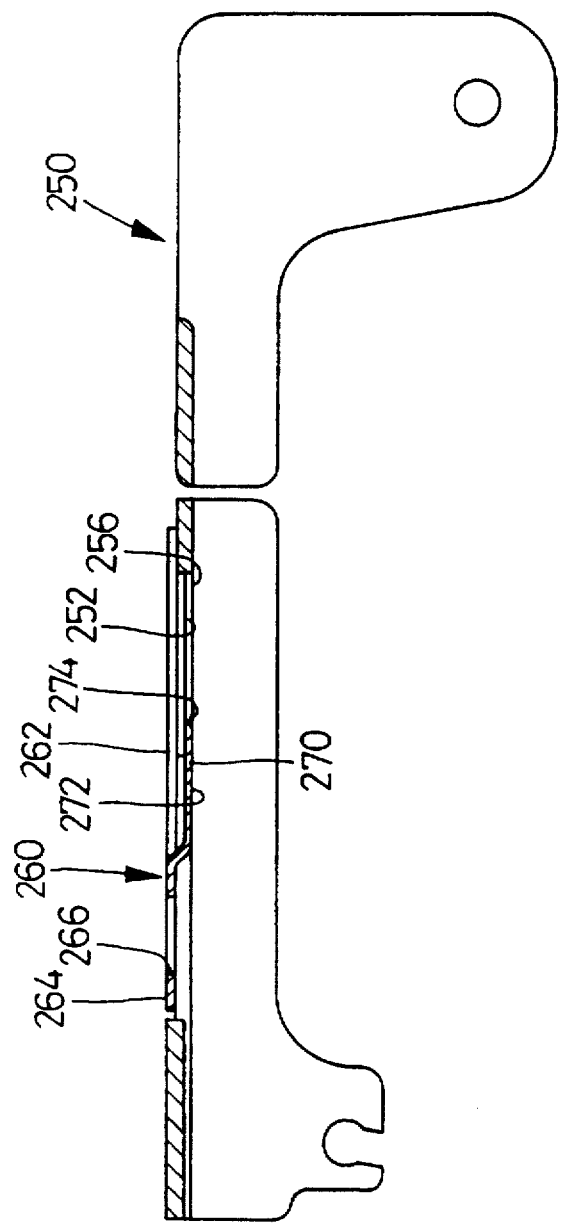
FIG. 13 is a cross-sectional side view of the cover and shutter of FIG. 12.

As shown in FIGS. 9 to 11, electronic components 48 supplied by each of the electronic-component cartridges 42 are provided in the form of an electronic-component carrier tape 50. The carrier tape 50 includes a component-accommodating tape 52 and a cover film 54 (FIG. 9). The electronic components 48 each of which has leads are accommodated in the component-accommodating tape 52 and are covered with the cover film 54.

As shown in FIG. 11, the component-accommodating tape 52 includes two side portions 56 extending parallel to a longitudinal direction of the carrier tape 50, and a number of container-like electronic-component accommodating portions 58 provided between the two side portions 56 and projecting downward from the side portions 56. The accommodating portions 58 are provided at a predetermined pitch in the longitudinal direction of the carrier tape 50, and each of the accommodating portions 58 has an electronic-component accommodating pocket 60 which opens in an upper surface of the electronic-component accommodating tape 52 and in which an electronic component 48 is accommodated.

The thin transparent cover film 54 is adhered to the upper surface of the electronic-component accommodating tape 52 to cover the respective openings of the electronic-component accommodating pockets 60. Feed holes 62 are formed at a predetermined pitch in one of the pair of side portions 56 of the electronic-component accommodating tape 52. Each feed hole 62 is formed through a thickness of that side portion 56.

The carrier tape 50 is wound around a reel 64 shown in FIG. 4. The reel 64 around which the carrier tape 50 is wound is attached to an attachment member 74 provided in rear of a cartridge frame 70, via a support axis 72 of the attachment member 74. The support axis 72 and the attachment member 74 cooperate with each other to provide a carrier-tape supporting device 76.

Figure 2:
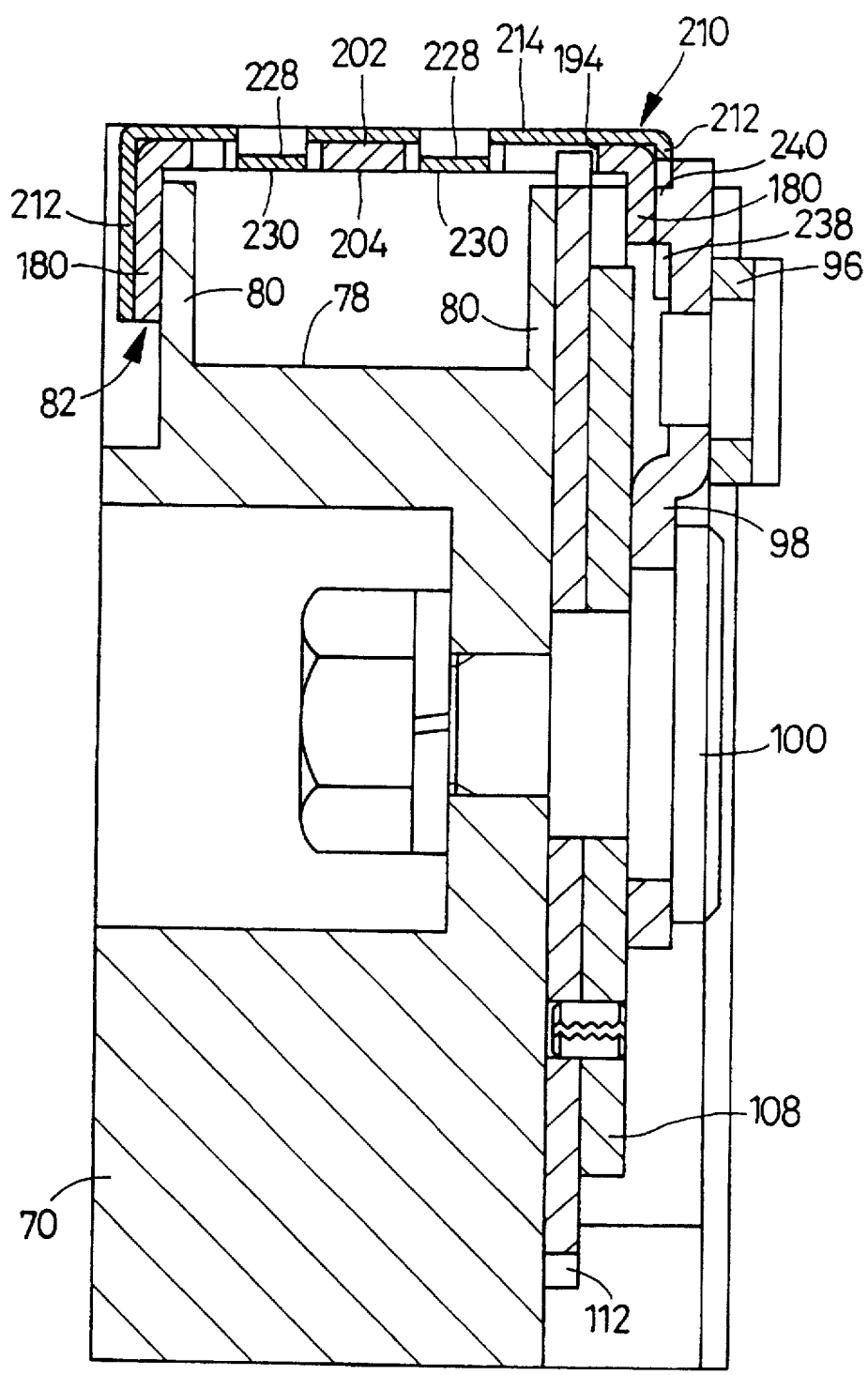
FIG. 2 is a cross-sectional side view of the electronic-component supplying cartridge, taken along II—II in FIG. 8.

The cartridge frame 70 has a generally elongate planar configuration, and is attached to the X table 40 such that the cartridge frame 70 stands upright and a length-wise and a width-wise direction of the frame 70 are horizontal. As shown in FIG. 2, a pair of support rails 80 are provided at opposite ends of a top surface 78 of the cartridge frame 70 which are spaced apart from each other in the width-wise direction of the frame 70. The support rails 80 project upward from the top surface 78 and extend in a direction of feeding of the carrier tape 50. A distance between of the two support rails 80 permits the electronic-component accommodating portions 58 to be fit in a space defined between the two rails 80. Thus, the carrier tape 50 is fed on the top of the cartridge frame 70 with the electronic-component accommodating portions 58 of the electronic-component accommodating tape 52 being fit in the space defined between the two rails 80 and with the two side portions 56 of the tape 52 being supported on the two rails 80, respectively.

The electronic-component carrier tape 50 thus supported on the support rails 80 is covered with a cover 82. The carrier tape 50 is fed by a tape feeding device 84 shown in FIG. 7, at a predetermined feeding pitch in a Y direction perpendicular to the X direction. The predetermined feeding pitch is equal to a predetermined pitch at which respective centers of the electronic-component accommodating pockets 60 are located in the longitudinal direction of the carrier tape 50.

The tape feeding device 84 includes a driving lever 90 rotatably attached via an axis member 88 to a bracket 86 fixed to the cartridge frame 70. The driving lever 90 is biased by a biasing device in the form of a tension coil spring 92, in a direction in which a lower end of the driving lever 90 is moved toward a front end of the cartridge frame 70. As the driving lever 90 is rotated in forward direction by a driving-lever rotating device (FIG. 6), a link 96 whose one end is rotatably connected to a lower portion of the lever 90 is moved frontward, so that a rotary plate 98 rotatably connected to the other end of the link 96 is rotated in a forward direction thereof.

Figure 8:
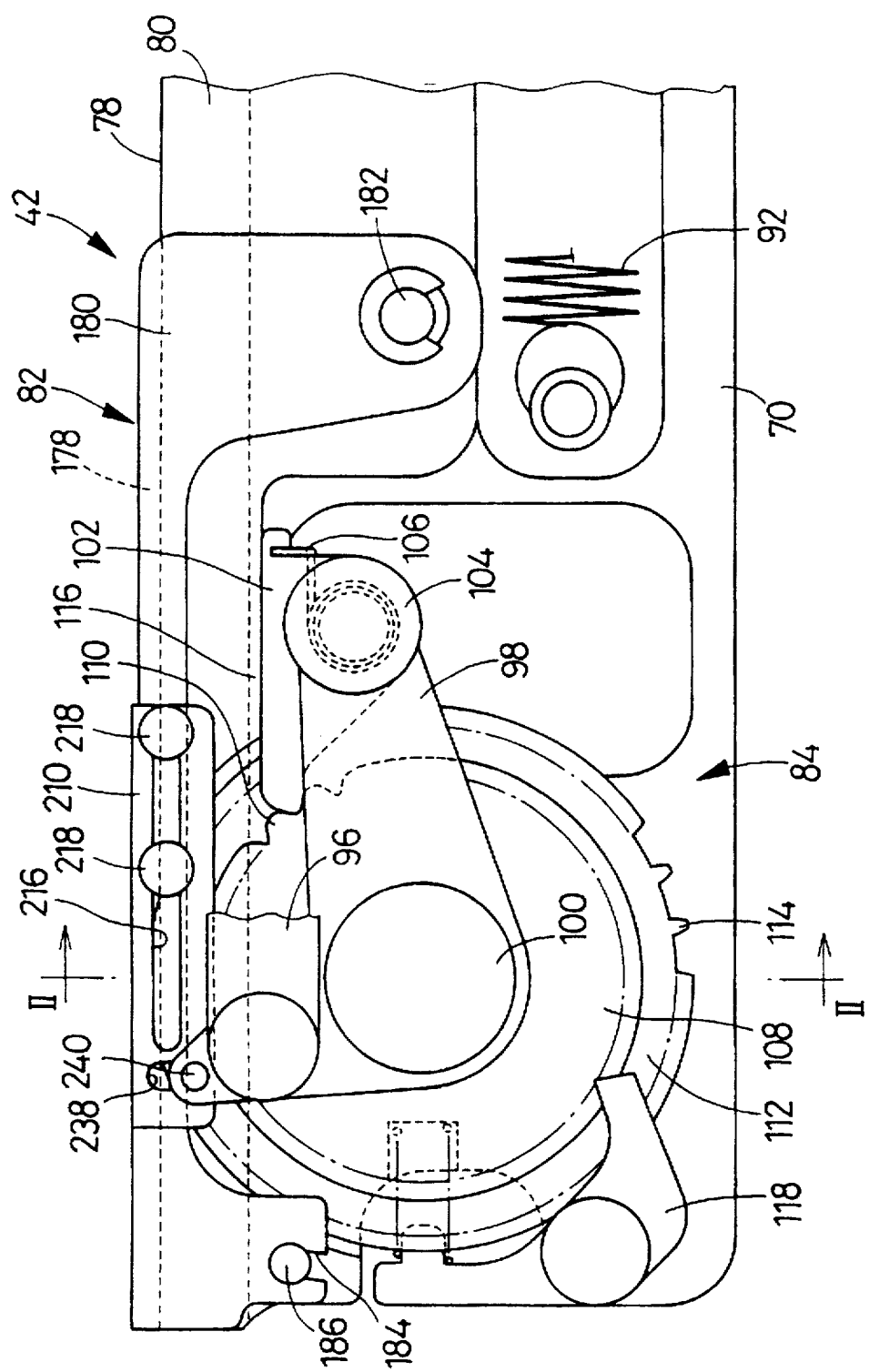
FIG. 8 is an enlarged side view of a front portion of the electronic-component supplying cartridge.

The rotary plate 98 is rotatably supported on a support axis 100 fixed to the cartridge frame 70, and is connected to the link 96. As shown in FIG. 8, a ratchet pawl 102 is attached to the rotary plate 98 via an axis member 104 such that the ratchet pawl 102 is rotatable relative to the rotary plate 98. The ratchet pawl 102 is biased by a biasing device in the form of a spring 106, in a direction in which the pawl 102 is engaged with teeth 110 of a ratchet wheel 108.

The ratchet wheel 108 is attached to a sprocket 112 rotatably supported by the support axis 100, such that the ratchet wheel 108 is not rotatable relative to the sprocket 112. Teeth 114 of the sprocket 112 are fit in the feed holes 62 of the electronic-component accommodating tape 52. Therefore, as the rotary plate 98 is rotated in the forward direction, the ratchet pawl 102 is moved while being kept in engagement with the teeth 110 of the ratchet wheel 108, so that the ratchet wheel 108 is rotated in a forward direction thereof and simultaneously the sprocket 112 is rotated in a forward direction thereof. Thus, the carrier tape 50 is fed forward. A limit of rotation of the rotary plate 98 in the forward direction is defined by abutment of the ratchet pawl 102 on a stopper projection 116 provided on the cartridge frame 70, in such a manner that a leading one of the electronic components 48 from which the cover film 54 has been removed is stopped at a predetermined position, i.e., electronic-component picking-up position.

When the driving lever 90 is moved in a backward direction, the link 96 is retracted backward and the rotary plate 98 is rotated in a backward direction thereof, so that the ratchet pawl 102 moves over the teeth 110 of the ratchet wheel 108. However, the rotation of the ratchet wheel 108 in a backward direction thereof is inhibited by a stopper lever 118. The feeding pitch of the carrier tape 50 corresponds to the number of teeth 110 over which the ratchet pawl 102 moves. Therefore, the tape feeding pitch can be changed by changing a limit of rotation of the driving lever 90 in the backward direction, or a limit of rotation of the rotary plate 98 in the backward direction. The limit of rotation of the driving lever 90 in the backward direction can be changed by changing the position of attachment of the lever 90 to the bracket 86, to a selected one corresponding to the feeding pitch of a selected carrier tape 50.

The driving-lever rotating device 94 is provided at the electronic-component supplying position of the index table 14. As shown in FIG. 6, the rotating device 94 includes an engagement lever 122, and an engagement-lever rotating device 124 for rotating the engagement lever 122. The engagement lever 122 is attached to an axis member 126 such that the lever 122 projects downward from the axis member 126. The axis member 126 is rotatably attached to the frame 35 such that the axis member 126 is rotatable about an axis line parallel to the axis line of rotation of the driving lever 90. An engagement roller 128 is rotatably attached to a lower end of the engagement lever 122. When each electronic-component supplying cartridge 42 is moved to the electronic-component supplying position, the engagement roller 128 is fit between a first and a second engagement portion 130, 132 provided at an upper end of the driving lever 90.

Another lever 134 is attached to the axis member 126 such that the lever 134 projects substantially horizontally, and is rotatably connected to a lower end of an elevating rod 136 extending vertically. A lever 140 which is rotatably attached via an axis member 138 to the frame 35 is rotatably connected to an upper end of the elevating rod 136. A follower roller 142 as a cam follower is rotatably attached to the lever 140, and a spring 144 as a biasing device biases the lever 140 in a direction in which the follower roller 142 is engaged with a cam surface 148 of a cam 146. As the cam 146 is rotated by the index motor, the engagement lever 122 is rotated in a forward and a backward direction thereof via the lever 140, the elevating rod 136, and the lever 134.

When the driving lever 90 is positioned at the limit of rotation thereof in the forward direction, the engagement roller 128 is spaced from both the first and second engagement portions 130, 132. In this condition, the movement of the X table in the X direction is carried out, so that the engagement roller 128 is fit between the first and second engagement portions 130, 132 without any trouble. The driving lever 90 is forcedly rotated both in the forward and backward directions thereof, without any substantial delay to the rotation of the engagement lever 122.

Figure 7:
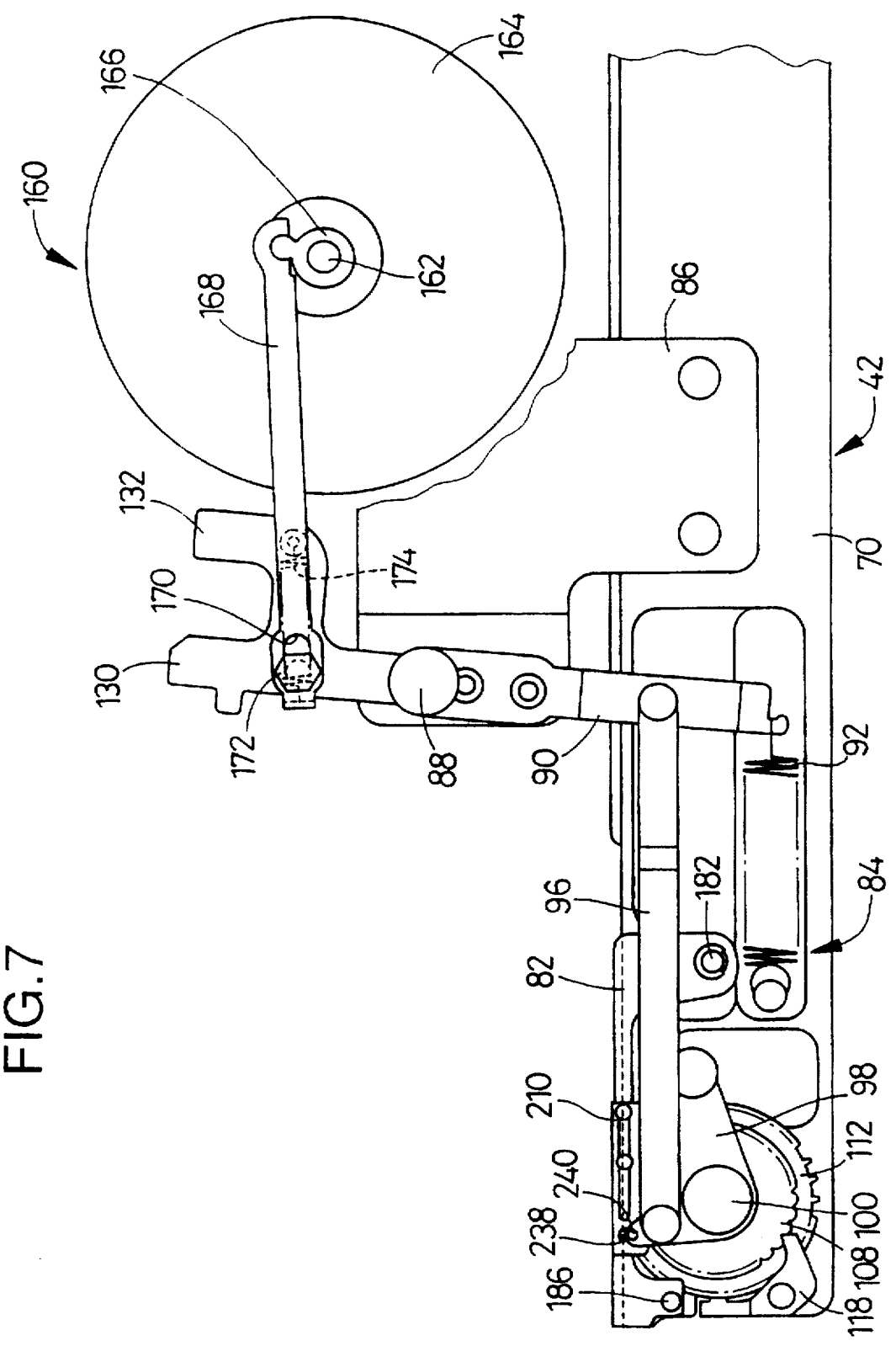
FIG. 7 is a side view of the electronic-component supplying cartridge.

The cover film 54 removed from the electronic-component accommodating tape 52 is taken up by a cover-film taking-up device 160 shown in FIG. 7. The taking-up device 160 includes a taking-up reel 164 which is rotatably attached to a support axis 162 fixed to the bracket 86. A taking-up lever 166 is rotatably attached to the support axis 162, and is engaged with one of opposite end portions of a link 168 the other end portion of which is supported by the driving lever 90.

An elongate hole 170 is formed in the other end portion of the link 168, and a pin 172 projecting from the driving lever 90 is fit in the elongate hole 170 such that the pin 172 is movable relative to the hole 170. A tension coil spring 174 as a biasing device is provided between the link 168 and the driving lever 90, and the biasing action of the coil spring 174 causes the link 168 to follow the rotation of the driving lever 90 in the forward direction thereof.

A first and a second one-way clutch (not shown) are provided between the taking-up reel 164, the taking-up lever 166, and the support axis 162. The first one-way clutch is provided between the taking-up reel 164 and the taking-up lever 166, and inhibits the rotation of the lever 166 relative to the reel 164 in a cover-film taking-up direction but permits the rotation of the former 166 relative to the latter 164 in an opposite direction. The second one-way clutch is provided between the support axis 162 and the taking-up reel 164, and permits the rotation of the reel 164 in the cover-film taking-up direction but inhibits the rotation of the same 164 in an opposite direction.

As shown in FIG. 8, the cover 82 includes a top plate 178 and a pair of side plates 180 extends downward from opposite side edges of the top plate 178, and accordingly has an inverted-U-shaped cross section. Respective rear portions of the side plates 180 are attached to the cartridge frame 70 via an axis member 182 such that the top plate 178 covers the top surface of the cartridge 70 and is rotatable relative to the frame 70. A recess 184 is formed in each of respective front portions of the side plates 180, and a support pin 186 projects from the cartridge frame 70 is fit in each recess 184.

The cover 82 and the pair of support rails 80 cooperate with each other to define a space therebetween which permits the carrier tape 50 to be fed therethrough. The carrier tape 50 is fed through the space defined by the rails 80 and the cover 82 in the front end portion of the cartridge frame 70.

Figure 1:
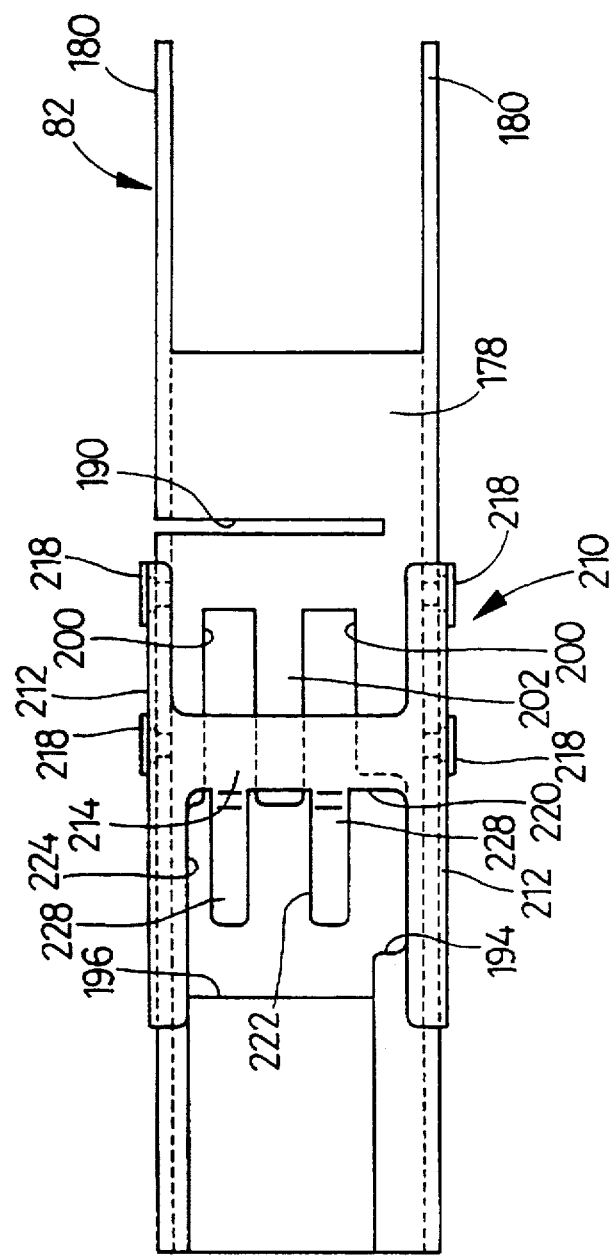
FIG. 1 is a plan view of a cover and a shutter of an electronic-component supplying cartridge as an embodiment of the present invention.

As shown in FIG. 1, the top plate 178 of the cover 82 has a slit 190 extending in a direction perpendicular to the direction of feeding of the carrier tape 50. A length of the cover film 54 removed from the carrier tape 50 is drawn out through the slit 190 and taken up by the taking-up reel 164.

The top plate 178 has a recess 194 at a location corresponding to the feed holes 62 formed in the carrier tape 50, so that the teeth 114 of the sprocket 112 are prevented from being interfered with by the cover 82. The top plate 178 additionally has a rectangular opening 196 at a location nearer to the front end of the cartridge frame 70 than the slit 190. Each electronic component 48 is picked up through the opening 196 by the component-suction head 22. The opening 196 has such dimensions which ensure that the electronic components 48 having a maximum dimension in the tape feeding direction are picked up therethrough.

The top plate 178 has a pair of receiving recesses 200 which extends upstream from an upstream-side end of the opening 196 as seen in the tape feeding direction, and an immovable jumping-out-preventing strip 202 formed between the two recesses 200. The immovable jumping-out-preventing strip 202 has a lower surface functioning as an immovable jumping-out-preventing surface 204. The pair of receiving recesses 200 are symmetrical with each other with respect to the middle line of the pair of support rails 80, and the immovable jumping-out-preventing surface 204 is located directly above the middle line of the support rails 80.

Figure 3:
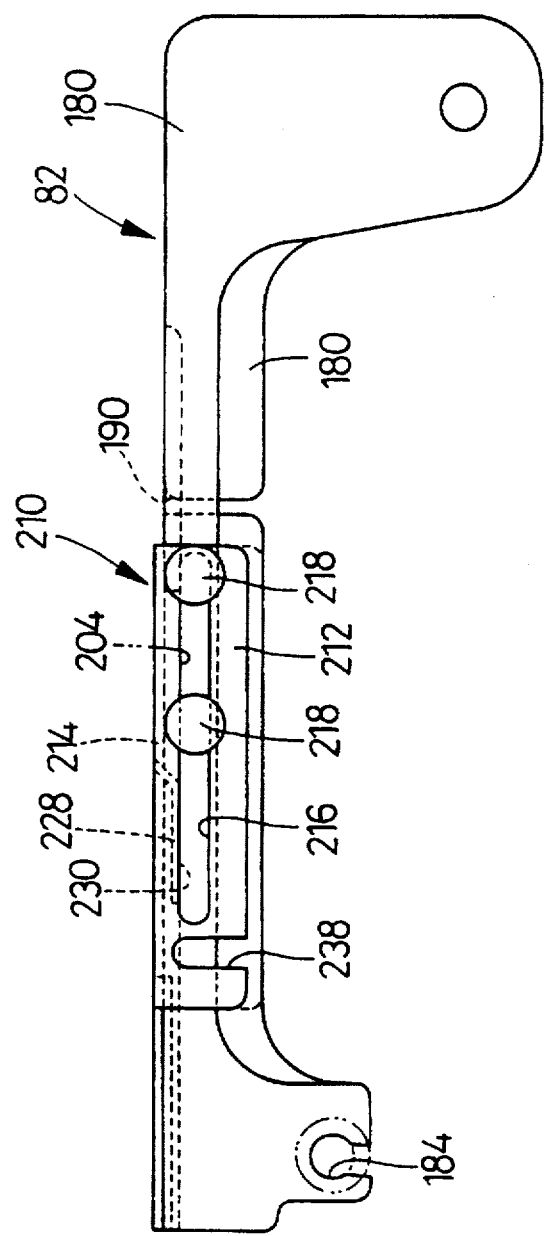
FIG. 3 is a side view of the cover and shutter.

A shutter 210 is attached to the cover 82 such that the shutter 210 is movable in a direction parallel to the tape feeding direction. The shutter 210 includes a pair of slideable portions 212 movably supported by the cover 82, and a connection portion 214 which extends in the width-wise direction of the cartridge frame 70 and connects between the two slideable portions 212. As shown in FIG. 3, each slideable portion 212 has an elongate hole 216 extending in the tape feeding direction. Stepped pins 218 each of which includes a head and a stepped axis, extend over respective axes thereof through the elongate hole 216. A small-diameter portion of the stepped axis of each pin 218 is caulked against a corresponding side plate 180 of the cover 82, and a large-diameter portion of the stepped axis of each pin 218 is located within the elongate hole 216 such that the large-diameter portion is movable relative to the hole 216 in the tape feeding direction. Thus, the respective large-diameter portions of the stepped pins 218 and the elongate holes 216 cooperate with each other to provide a shutter guiding device for guiding the movement of the shutter 210 relative to the cover 82.

The connection portion 214 has a groove 222 at a location corresponding to the middle line of the pair of support rails 80 in the width-wise direction, and two grooves 220, 224 at respective locations corresponding to two outside portions of the cover 82 externally defining the two receiving recesses 200, respectively. Each of the grooves 220, 222, 224 extends in the tape feeding direction. Thus, the shutter 210 has two movable jumping-out-preventing strips 228 having respective widths which ensure that the movable jumping-out-preventing strips 228 are received in the receiving recesses 200, respectively.

The movable jumping-out-preventing strips 228 have a length which ensures that the strips 228 cover the electronic components 48 having the maximum dimension in the tape feeding direction. The shutter 210 and the cover 82 can be used to cover a plurality of sorts of carrier tapes 50 carrying a plurality of sorts of electronic components 48 having different sizes, respectively. As shown in FIG. 3, each movable jumping-out-preventing strip 228 is bent at a base portion thereof toward the cover 82, so that a lower surface of the strip 228 provides a movable jumping-out-preventing surface 230 flush with the immovable jumping-out-preventing surface 204 of the cover 82.

The electronic-component picking-up position of each electronic-component supplying cartridge 42 is defined as the position where the center line of the component-suction nozzle 26 of the component-suction unit 18 positioned at the electronic-component supplying position of the index table 14 intersects the center line of the groove 222 of the shutter 210 as seen in the width-wise direction of the shutter 210. The groove 222 between the two movable jumping-out-preventing strips 228 has a width greater than a diameter of the component-suction nozzle 26 and smaller than a width (i.e., dimension in a direction perpendicular to the tape feeding direction) of the electronic components 48 supplied by the cartridge 42. The shutter 210 and the cover 82 can be used to cover a carrier tape 50 in the case where electronic components 48 carried by the carrier tape 50 have a width greater than the width of the groove 222 and the diameter of the component-suction nozzle 26 used to pick up the components 48 is smaller than the width of the groove 222. The shutter 210 and the cover 82 can be used to cover a plurality of sorts of carrier tapes 50 carrying a plurality of sorts of electronic components 48 having different sizes, respectively.

As shown in FIG. 3, each of the slideable portions 212 has a recess 238 which extends vertically and opens downward. As shown in FIG. 2, a projection 240 provided on the rotary plate 98 is fit in the recess 238. As the rotary plate 98 is rotated, the shutter 210 is moved in the tape feeding direction. When the rotary plate 98 is positioned at the limit of rotation thereof in the backward direction, the pair of movable jumping-out-preventing strips 228 of the shutter 210 are positioned at a second position thereof where the pair of strips 228 are received in the pair of receiving recesses 200 of the cover 82, respectively. The second position is apart from a first position of the shutter 210 right above the electronic-component picking-up position. When the rotary plate 98 is rotated in the forward direction, the shutter 210 is moved forward together with the carrier tape 50, and the pair of movable jumping-out-preventing strips 228 are moved to the first position thereof above the component picking-up position.

The cam surface 148 of the driving-lever rotating device 94 is designed such that while the index table 14 is rotated, the engagement lever 122 is not rotated and that after the index table 14 has been stopped and when the component-suction head 22 is moved downward and upward to pick up each electronic component 48 from the pocket 60 of the carrier tape 50, the engagement lever 122 is rotated to feed the carrier tape 50 and take up the cover film removed from the tape 50.

More specifically described, the cam surface 148 of the driving-lever rotating device 94 and a cam surface of the cam (not shown) employed for rotating the lever 36 of the component-suction-head elevating device 30 are designed such that after the carrier tape 50 has been fed, the component-suction head 22 is lowered to the electronic-component suction position thereof concurrently (in synchronism) with the retracting movement of the shutter 210 to the second position thereof and holds by suction the electronic component 48 before completion of the movement of the shutter 210 to the second position.

Next, there will be described the operation of the present embodiment.

When the rotary plate 98 of the tape feeding device 84 is positioned at the limit of rotation thereof in the backward direction thereof, the shutter 210 is positioned at the second position thereof where the pair of movable jumping-out-preventing surfaces 230 and the immovable jumping-out-preventing surface 204 covers the electronic component 48 accommodated in the electronic-component accommodating pocket 60 positioned adjacent to the electronic-component picking-up position on the upstream side of the picking-up position as seen in the tape feeding direction. If the engagement lever 122 of the driving-lever rotating device 94 is rotated in the forward direction thereof and accordingly the driving lever 90 is rotated in the forward direction thereof, the rotary plate 98 is rotated in the forward direction thereof so that the electronic-component carrier tape 50 is fed forward.

Although the engagement lever 122 is rotated at a high speed to increase the speed of feeding of the carrier tape 50, the driving lever 90, link 96, rotary plate 98, etc. tend to rest due to inertia. While this inertial force is greater than the biasing force of the tension coil spring 92, the engagement roller 128 of the engagement lever 122 is kept away from the first engagement portion 130 of the driving lever 90 and kept in engagement with the second engagement portion 132 of the driving lever 90, so that the driving lever 90 is forcedly rotated in the forward direction thereof. Stated differently, a force equal to the difference between the biasing force of the tension coil spring 92 and the inertial force of the driving lever 90 and others, is exerted from the engagement lever 122 to the second engagement portion 132, so that the driving lever 90 is rotated in the forward direction thereof at a speed higher than a speed at which the lever 90 would be rotated with only the biasing force of the coil spring 92.

If the angular acceleration of the engagement lever 122 decreases and accordingly the angular accelerations of the driving lever 90 and the rotary plate 98 and the acceleration of the link 96 decrease, the inertial force of those elements 90, 98, 96 decreases and the biasing force of the tension coil spring 92 decreases. Therefore, the driving lever 90 and others are moved in the forward direction thereof because of the biasing force of the tension coil spring 92, and the second engagement portion 132 is moved away from the engagement roller 128 and the first engagement portion 130 is engaged with the roller 128. Then, the ratchet pawl 102 abuts on the stopper projection 116, so that the rotation of the rotary plate 98 is stopped and the rotation of the driving lever 90 is also stopped via the link 96. However, the engagement lever 122 is rotated further by a small angle, so that the engagement roller 128 is moved away from the first engagement portion 130 and is stopped at a neutral position where the roller 128 cannot be engaged with the second engagement portion 132.

Thus, the electronic-component carrier tape 50 is fed forward and the shutter 210 is moved from the second position thereof to the first position thereof together with the carrier tape 50, so that respective ends of the leading one of the electronic components 48 from which the cover film 54 has been uncovered, are covered with the pair of movable jumping-out-preventing surfaces 230, respectively. The respective ends of the leading component 48 covered with the surfaces 230 are opposite to each other in a direction perpendicular to the tape feeding direction. Thus, the leading component 48 is fed to the electronic-component picking-up position while being prevented from jumping out of the electronic-component accommodating pocket 60.

When the driving lever 90 is rotated, the link 168 is moved so that a force is exerted to rotate the taking-up lever 166 in the cover-film taking-up direction. Thus, the taking-up lever 166 is rotated in the cover-film taking-up direction, so that the taking-up reel 164 takes up the cover film 54. Since the rotation of the lever 166 relative to the reel 164 in the taking-up direction is inhibited by the first one-way clutch and the second one-way clutch permits the rotation of the reel 164 relative to the support axis 162 in the taking-up direction, the lever 166 and the reel 164 are rotated as a unit when the lever 166 is moved by the tension coil spring 174. Thus, the cover film 54 is taken up by a length equal to one pitch of the carrier tape 50.

As the diameter of the cover film 54 wound around the taking-up reel 164 increases, the angle of rotation of the reel 164 needed to take up the cover film 54 over a length equal to one pitch of the carrier tape 50 decreases. The change of the needed rotation angle is accommodated by a spacing produced between the pin 172 projecting from the driving lever 90, and an inner end wall of the elongate hole 170. After the cover film 54 is removed over one pitch, the tensile force of the cover film 54 becomes greater than the biasing force of the tension coil spring 174, so that the reel 164 and lever 166 cannot be rotated any more and the spacing is produced between the the pin 172 and the end wall of the elongate hole 170. The needed rotation angle decreases as the the outer diameter of the cover film 54 increases.

The electronic-component supplying cartridge 42 is usually kept in a state thereof taken just after the tape feeding in which state neither the first nor second engagement portion 130, 132 of the driving lever 90 is engaged with the engagement roller 128 of the engagement lever 122. Therefore, when the X table 40 is moved, the driving lever 90 of each cartridge 42 can pass through the engagement lever 122 resting adjacent to the electronic-component picking-up position.

When one of the electronic-component supplying cartridges 42 is stopped at the electronic-component supplying position, the first and second engagement portions 130, 132 of the driving lever 90 of that cartridge 42 sandwich the engagement roller 128 of the engagement lever 122 with small clearances left therebetween.

Then, if the engagement lever 122 is rotated in the backward direction thereof, the driving lever 90 is rotated in the backward direction thereof against the biasing force of the tension coil spring 92 and the inertial force of the lever 90, link 96, rotary plate 98, etc. Thus, the rotary plate 98 is rotated in the backward direction thereof, and the shutter 210 is retracted to the second position thereof. In synchronism with the retracting movement of the shutter 210, the component-suction nozzle 26 is moved downward. The nozzle 26 is moved downward at such a timing which ensures that the nozzle 26 contacts the electronic component 48 before the movable jumping-out-preventing surfaces 230 are retracted away from above the component 48. Thus, the component 48 is held by suction by the nozzle 26 while being covered with the movable jumping-out-preventing strips 228 and thereby being prevented from standing up in the electronic-component accommodating pocket 60 because of suction of the nozzle 26. Accordingly, when the shutter 210 is moved to, and stopped at, the second position thereof, the electronic component 48 has already been held by the nozzle 26. Thus, the component 48 is prevented from jumping out of the pocket 60. After the movable jumping-out-preventing surfaces 230 have been retracted away from above the component 48, the nozzle 26 is moved upward to pick up the component 48 from the pocket 60.

When the driving lever 90 is rotated in the backward direction thereof, a force is exerted to rotate the taking-up lever 166 in a direction opposite to the cover-film taking-up direction. Since this rotation is permitted by the first one-way clutch, and the rotation of the taking-up reel 164 in the same direction is inhibited by the second one-way clutch, only the lever 166 is rotated and the reel 164 is not rotated.

Immediately after the picking-up of the electronic component 48 and the taking-up of the cover film 54, the engagement lever 122 is rotated in the forward direction thereof and the driving lever 90 is rotated in a clockwise direction as seen in FIG. 6, so that the leading one of the electronic components 48 accommodated in the electronic-component accommodating pockets 60 from which the cover film 54 has been removed, is fed to the electronic-component picking-up position and thus prepares for being picked up by the component suction nozzle 26. In this state, the current electronic-component supplying cartridge 42 can be replaced by another cartridge 42.

As is apparent from the foregoing description, in the present electronic-component supplying and picking-up apparatus, the ratchet wheel 108 and the ratchet pawl 102 cooperate with each other to provide a selected-movement transmitting device; the rotary plate 98 provides a rotary member as a sort of feeding member; and the selected-movement transmitting device and the rotary member cooperate with each other to provide a feeding mechanism. The driving lever 90, the cam 146 as a second cam, the follower roller 142 as a second cam follower, the driving-lever rotating device 94 as a driving-member moving device, and the link 96 as a transmitting member cooperate with one another to provide a feeding-member-related transmitting device; and the feeding-member-related transmitting device cooperates with the feeding mechanism to provide the tape feeding device 84.

The cover 82 provides an immovable jumping-out-preventing member; the shutter 210 provides a movable jumping-out-preventing member; and the movable jumping-out-preventing strips 228 provide movable jumping-out-preventing portions. The projection 240 provided on the rotary plate 98 and the recess 238 provided on the shutter 210 cooperate with each other to provide a movable jumping-out-preventing-member-related transmitting device and simultaneously provide a movable jumping-out-preventing-member moving device.

The lever 36, the elevating member 32, and the motion transmitting device which converts the motion of the cam follower (not shown) into the rotation of the lever 36, cooperate with one another to provide a suction-nozzle-related transmitting device; the suction-nozzle-related transmitting device cooperates with the cam and the cam follower (not shown) to provide the component-suction-nozzle elevating device 30 as a component-suction-nozzle advancing and retracting device.

The cam surface of the cam of the component-suction-nozzle elevating device 30 and the cam surface 148 of the cam 146 of the driving-lever rotating device 94 cooperate with each other to provide a synchronizing device which ensures that the retracting movement of the movable jumping-out-preventing strips 228 is completed after the component suction nozzle 26 has held by suction the electronic component 48.

A portion of the electronic-component mounting apparatus 10 which is for picking up the electronic components 48 from the electronic-component supplying cartridge 42, cooperates with the electronic-component supplying cartridge 42 to provide an electronic-component supplying and picking-up apparatus.

A portion of the cover 82 located on a downstream side of the opening 196 in the tape feeding direction, provides a jumping-up preventing portion.

In the case where it is deemed that the present invention is embodied as an electronic-component supplying and picking-up apparatus, the structural elements employed in the present embodiment correspond to the terms used in the claims as identified above. However, it can be deemed that the present invention is embodied as an electronic-component supplying cartridge. In the latter case, none of the cam 146, follower roller 142, driving-lever rotating device 94, etc. can be thought as structural elements of the cartridge. Accordingly, the ratchet wheel 108 and the ratchet pawl 102 are deemed as the selected-movement transmitting device; the rotary plate 98 is deemed as the rotary member as a sort of feeding member; and the selected-movement transmitting device and the rotary plate 98 cooperate with the driving lever 90 as a driving member and with the link 96 as a transmitting member to provide the tape feeding device.

Since in the illustrated embodiment the pair of movable jumping-out-preventing portions are received in the pair of receiving portions in the form of recesses 200, respectively, the formation of the receiving portions is easy. However, the receiving portions may be provided as receiving pockets 252 formed in a cover 250 as the immovable jumping-out-preventing member.

The cover 250 has an opening 254 at a location corresponding to an electronic-component picking-up position. The receiving pockets 252 open in an immovable jumping-out-preventing surface 256 provided by a lower surface of the cover 250 on the side of a cartridge frame, and open at an upstream-side edge of the opening 254 as seen in a tape feeding direction. The pockets 252 extend upstream of the opening 254 in the tape feeding direction.

A shutter 260 as a movable jumping-out-preventing member includes a pair of slideable portions 262, and a connection portion 264 connecting between the slideable portions 262. Like the previously-described shutter 210, the slideable portions 262 of the shutter 260 are attached to the cover 250 such that the shutter 260 is movable relative to the cover 250 in the tape feeding direction with the help of screws and elongate holes.

The connection portion 264 has an opening 266 having dimensions ensuring that an electronic component having a maximum dimension in the tape feeding direction is picked up through the opening 266. A groove 268 is formed which extends upstream of the opening 266 in the tape feeding direction and opens at an upstream-side end thereof. Thus, a pair of movable jumping-out-preventing strips 270 which are receivable in the pair of receiving pockets 252, respectively, are formed on both sides of the groove 268. Respective base portions of the movable jumping-out-preventing strips 270 are bent toward the cartridge frame, so that respective lower surfaces of the strips 270 provide movable jumping-out-preventing surfaces 272 flush with the immovable jumping-out-preventing surface 256. Each of the strips 270 has an inclined end surface 274 which approaches the connection portion 264 as approaching the cartridge frame.

Like the shutter 210, the shutter 260 is movable between a first and a second position thereof, based on the engagement of a projection provided on a rotary plate of a tape feeding device with a recess formed in the slideable portions 262, when the rotary plate is rotated. Each of the movable jumping-out-preventing strips 270 has a length which ensures that even if the shutter 260 is moved to the first position thereof, each strip 270 does not completely come out of a corresponding receiving pocket 252.

After the rotary plate has been rotated in a backward direction thereof and a ratchet pawl has been moved over a predetermined number of teeth of a ratchet wheel, i.e., after the tape feeding device has prepared for the next tape feeding, the shutter 260 is positioned at the retracted position thereof where the pair of movable jumping-out-preventing strips 270 are received up to the respective base portions thereof in the pair of receiving pockets 252, respectively, and where the opening 266 is positioned at the electronic-component picking-up position.

When the rotary plate is rotated in the forward direction thereof and an electronic-component carrier tape is fed forward, the shutter 260 is moved to the first position thereof while covering respective end portions of the electronic component which are opposite to a direction perpendicular to the tape feeding direction. If, after the tape feeding, the rotary plate is rotated in the backward direction thereof, the shutter 260 is retracted, and the electronic component is positioned within the opening 266, so that the component can be picked up from the electronic-component accommodating pocket. In synchronism with the retracting movement of the shutter 260, the component-suction nozzle is moved downward, and holds by suction the component before completion of the pair of movable jumping-out-preventing strips 270 from above the component. Thus, jumping of the component from the component accommodating pocket and failing to hold the component are effectively prevented.

When the shutter 260 is retracted, the pair of movable jumping-out-preventing strips 270 are moved toward the upstream within the receiving pockets 252. Since, however, the strips 270 have the inclined end surfaces 274, respectively, the strips 270 can be moved without being jammed with the electronic-component carrier tape or the electronic components.

Figure 14:
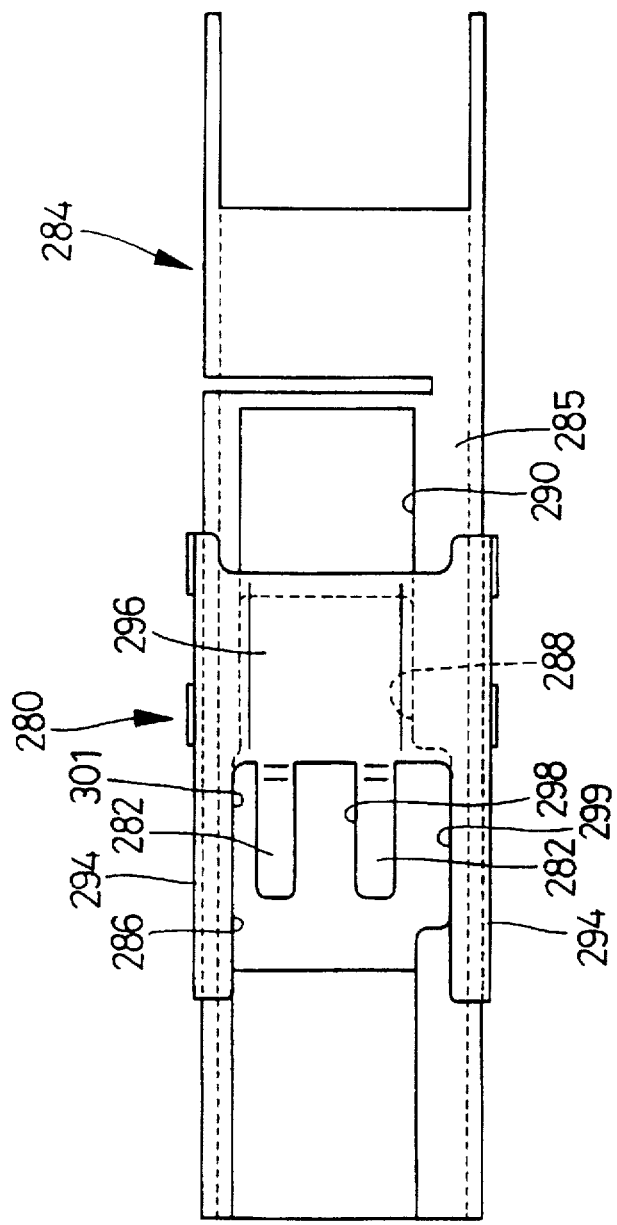
FIG. 14 is a plan view of a cover and a shutter of an electronic-component supplying cartridge as yet another embodiment of the present invention.
Figure 15:
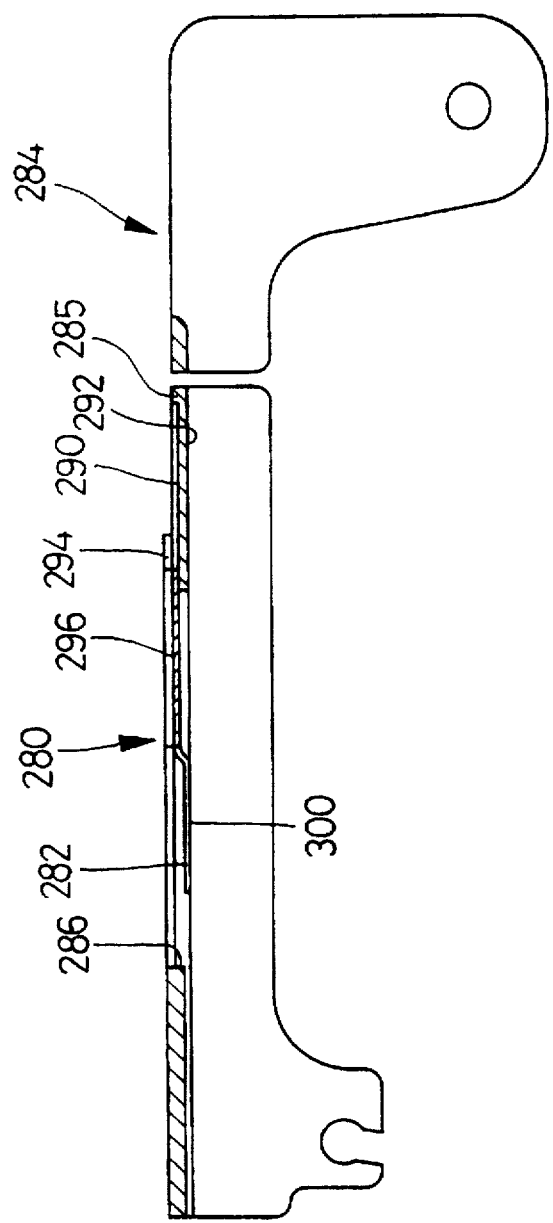
FIG. 15 is a cross-sectional side view of the cover and shutter of FIG. 14.

It is not essentially required that when the movable jumping-out-preventing member is positioned at the second position thereof, the movable jumping-out-preventing surfaces and the immovable jumping-out-preventing surface cooperate with each other to cover an electronic component. As shown in FIGS. 14 and 15, when a shutter 280 as the movable jumping-out-preventing member is positioned at a second position thereof, a pair of movable jumping-out-preventing surfaces 282 cover an electronic component without cooperating with a cover 284 as the immovable jumping-out-preventing member.

The cover 284 includes a top plate 285 which has an opening 286 at a location corresponding to an electronic-component picking-up position. A recess 288 opens at an upstream-side edge of the opening 286 as seen in a tape feeding direction. The recess 288 is formed through a thickness of the cover 284, and has a width to receive the pair of movable jumping-out-preventing surfaces 282. The top plate 285 additionally has a shallow wide receiving groove 290 which opens in an upper surface of the top plate 285 and in the recess 288. A lower surface of the receiving groove 290 provides an immovable jumping-out-preventing surface 292.

The pair of movable jumping-out-preventing surfaces 282 are provided by forming, in a connecting portion 296 connecting between a pair of slideable portions 294 of a shutter 280, grooves 298, 299, 301 which extend in the tape feeding direction and open at respective downstream-side ends thereof. The connection portion 296 is bent toward the cover 284, so that as shown in FIG. 15 the connection portion 296 is received in the receiving groove 290. Respective base portions of the movable jumping-out-preventing strips 282 are bent, so that respective lower surfaces of the strips 282 provide movable jumping-out-preventing surfaces 300 flush with the immovable jumping-out-preventing surface 292. The connection portion 296 has a length enough to cover the recess 288 of the cover 284 even if the shutter 280 is positioned at a first position thereof.

When the shutter 280 is positioned at the second position thereof, the pair of movable jumping-out-preventing strips 282 are positioned within the recess 288 to cover respective end portions of the electronic component which are opposite to each other in a direction perpendicular to the tape feeding direction. When an electronic-component carrier tape is fed, the shutter 280 is moved to the first position thereof together with the component while covering the component. When the shutter 280 is positioned at the first position thereof, a portion of the carrier tape which is adjacent to the electronic-component picking-up position, on an upstream side of the picking-up position in the tape feeding direction, does not contact the shutter 280 nor the cover 284. However, the top plate 285 of the cover 284 in which the receiving groove 290 is formed is thin, and a distance between the connection portion 296 of the shutter 280 received in the receiving groove 290 of the cover 284 and the carrier tape is very small. Therefore, the electronic component accommodated in the electronic-component accommodating pocket is effectively prevented from standing up because of suction. After the component is held by suction, the shutter 280 is moved to the second position thereof to cover another electronic component which is next fed to the electronic-component picking-up position.

Figure 16:
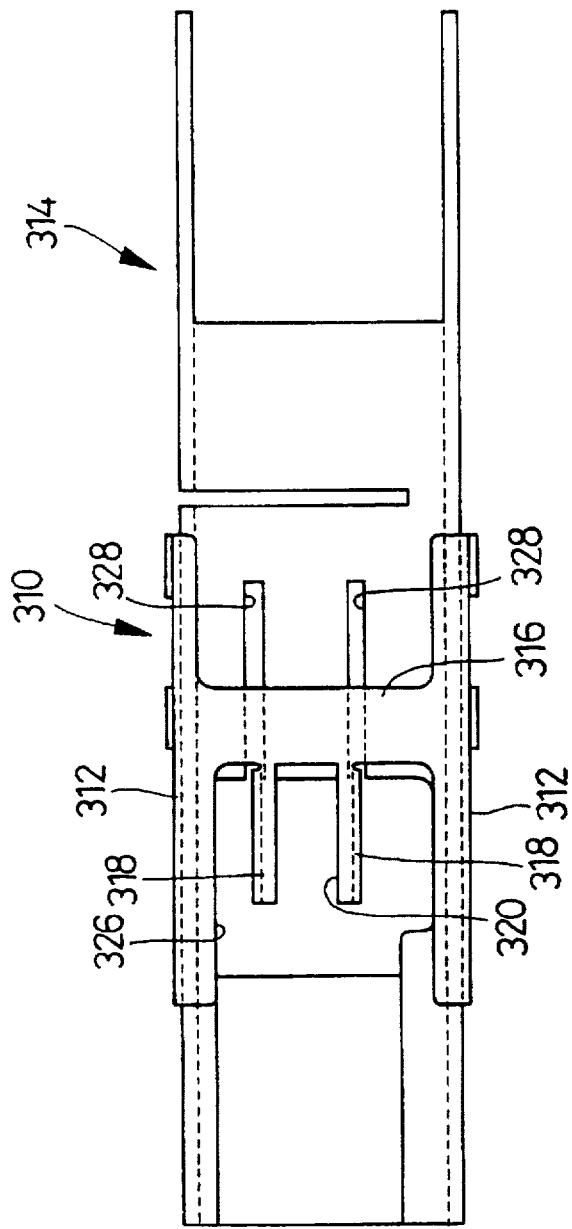
FIG. 16 is a plan view of a cover and a shutter of an electronic-component supplying cartridge as yet another embodiment of the present invention.
Figure 17:
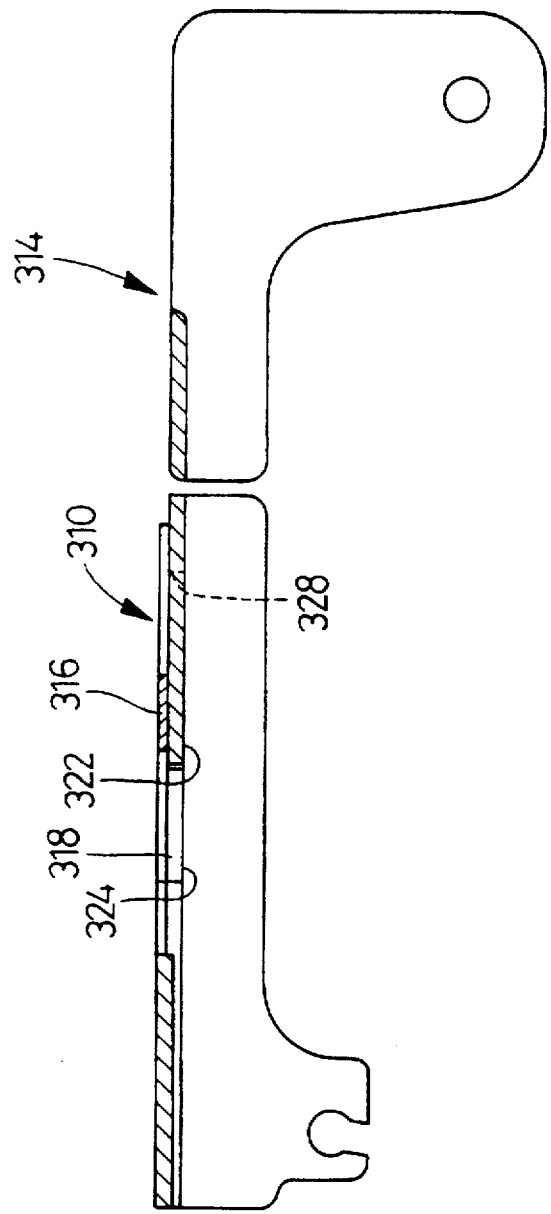
FIG. 17 is a cross-sectional side view of the cover and shutter of FIG. 16.

In each of the previously-described embodiments, the movable jumping-out-preventing surface has a considerably great width. However, as shown in FIGS. 16 and 17, the movable jumping-out-preventing surface may be one having a small width. Like the shutter 210 shown in FIGS. 1 to 11, a shutter 310 includes a pair of slideable portions 312 which are attached to a cover 314 such that the shutter 310 is movable relative to the cover 314 with the help of stepped pins and elongate holes. The shutter 310 additionally includes a connection portion 316 which connects between the slideable portions 312 and has a pair of movable jumping-out-preventing tongues 318 each having an L-shaped cross section.

The movable jumping-out-preventing tongues 318 are provided by forming, in the shutter 310 having an inverted-U-shaped cross section, a groove 320 which extends in the tape feeding direction and opens at a downstream-side end thereof. A lower surface of each of the movable jumping-out-preventing tongues 318 provides a movable jumping-out-preventing surface 324 flush with an immovable jumping-out-preventing surface 322 provided by a lower surface of the cover 314 located on the side of a cartridge frame. The groove 320 has a width greater than a diameter of a component-suction nozzle and shorter than a width-wise dimension of the electronic components.

The cover 314 has an opening 326 through which each electronic component is picked up, and has a pair of receiving slots 328 which extend upstream of the opening 326 in the tape feeding direction and open at an upstream-side end of the opening 326. The movable jumping-out-preventing tongues 318 are receivable in the receiving slots 328, respectively.

Like the shutter 210, the shutter 310 is connected to a rotary plate of a tape feeding device with the help of a projection and a recess, so that the shutter 310 is moved between a first and a second position thereof as the rotary plate is rotated. When the shutter 310 is positioned at the second position thereof, the pair of movable jumping-out-preventing tongues 318 are received in the pair of receiving slots 328, respectively, so that the electronic component is is prevented from jumping out of the electronic-component accommodating pocket. When an electronic-component carrier tape is fed, the shutter 310 is moved to the first position thereof together with the component while preventing the component from jumping out of the component accommodating pocket. In synchronism with the downward movement of a component-suction nozzle, the shutter 310 is moved to the second position thereof so that after the nozzle has held by suction the component, the shutter 310 uncovers the component.

Since the movable jumping-out-preventing surfaces have small widths, those surfaces can cover respective end portions of an electronic component which are opposite to each other in a direction perpendicular to the tape feeding direction, even if the component has a very small width. Therefore, the component is effectively prevented from jumping out of the component accommodating pocket.

In the above-described embodiments, the second position of the shutter 210, 260, 280, 310 as the movable jumping-out-preventing member is located on an upstream side of the electronic-component picking-up position in the tape feeding direction, it is possible to locate the second position of the movable jumping-out-preventing member on a downstream side of the picking-up position, as shown in FIGS. 18 to 21.

Figure 18:
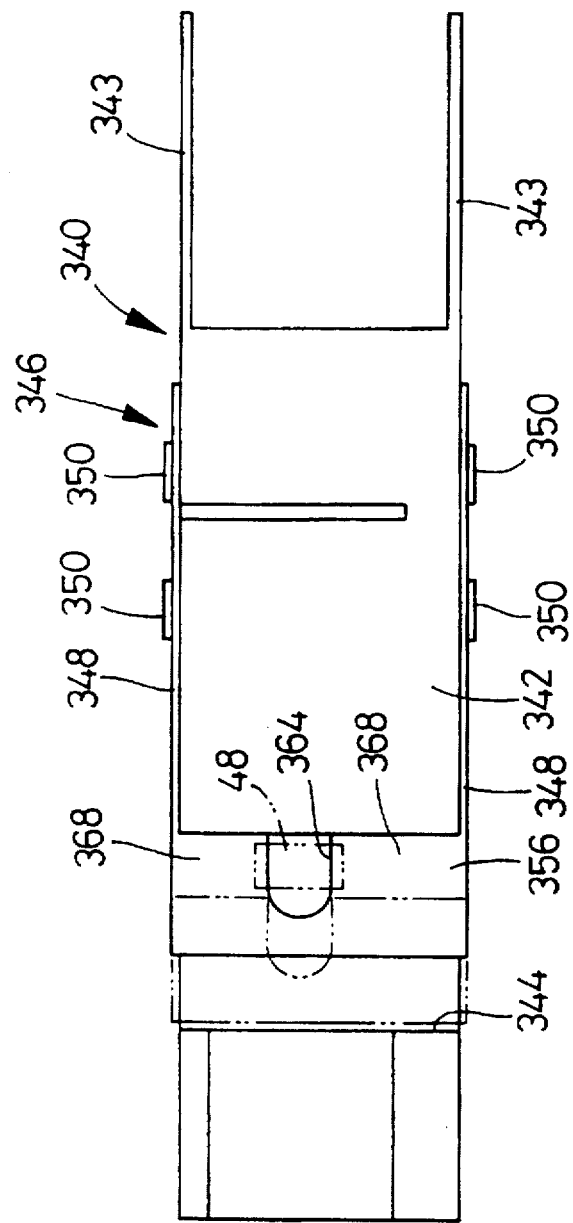
FIG. 18 is a plan view of a cover and a shutter of an electronic-component supplying cartridge as yet another embodiment of the present invention.
Figure 19:
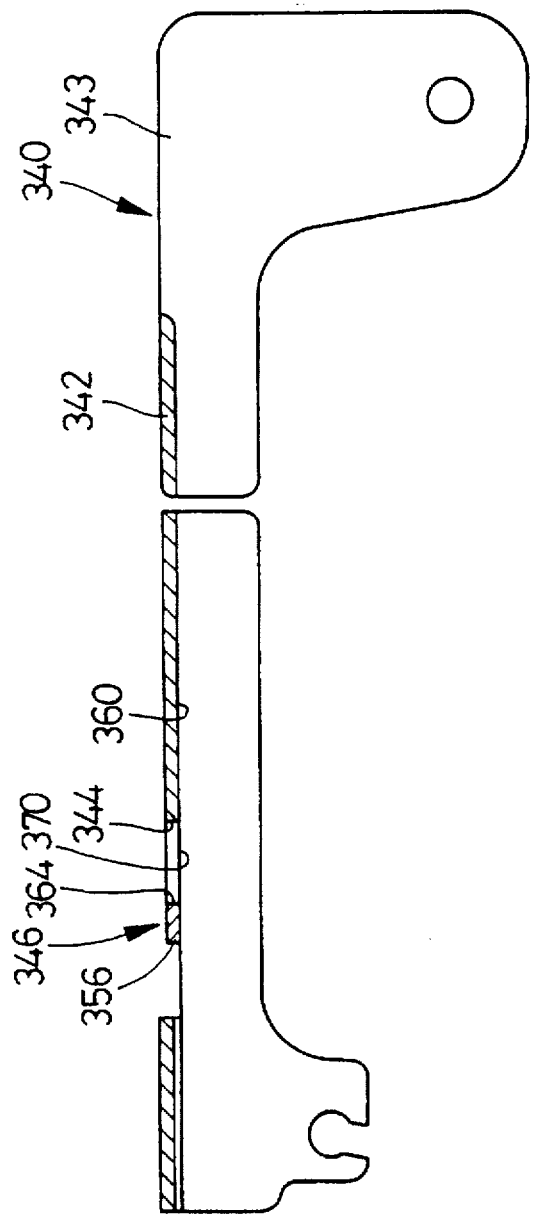
FIG. 19 is a cross-sectional side view of the cover and shutter of FIG. 18.

In the embodiment shown in FIGS. 18 to 21, a cover 340 has an inverted-U-shaped cross section. As shown in FIGS. 18 and 19, a recess 344 is formed by cutting away a portion of a top plate 342 which corresponds to an electronic-component picking-up position, and cutting away respective upper end portions of a pair of side plates 343. Thus, the recess 344 extends in a direction perpendicular to a tape feeding direction. A shutter 346 is provided within the recess 344.

Like the shutter 210, the shutter 346 includes a pair of slideable portions 348 which are attached to the pair of side plates 343 of the cover 340 with the help of stepped pins 350 and elongate holes 352 such that the shutter 346 is movable relative to the cover 340 in the tape feeding direction. The shutter 346 additionally includes a connection portion 356 which is located within the recess 344 and has a lower surface flush with an immovable jumping-out-preventing surface 360 provided by a lower surface of the cover 340 on the side of a cartridge frame 358.

The connection portion 356 has a groove 364 which extends in the tape feeding direction and opens at an upstream-side end thereof. The connection portion 356 additionally has a pair of movable jumping-out-preventing portions 368 formed on both sides of the groove 364, respectively. Respective lower surfaces of the movable jumping-out-preventing portions 368 provide two movable jumping-out-preventing surfaces 370, respectively. A tension coil spring 372 (FIG. 20) as a biasing device is provided between the shutter 346 and the cover 340. The coil spring 372 biases the shutter 346 in a direction in which the connection portion 356 abuts on an upstream-side end wall of the recess 344.

Like the shutter 210, the shutter 346 is moved by a rotary plate 378 (FIG. 20) as part of a tape feeding device 376. The rotary plate 378 is rotatably supported on a support axis 380 fixed to the cartridge frame 358. Like the previously-described rotary plate 98, a link 382 is connected to the rotary plate 378. Like the previously-described link 96, the link 382 is moved when a driving lever is rotated by a driving-lever rotating device, so that the rotary plate 378 is rotated.

A ratchet-pawl supporting plate 386 is rotatably attached to the support axis 380. A ratchet pawl 388 is rotatably attached to the supporting plate 386, and is biased by a spring 390 in a direction in which to engage teeth 394 of a ratchet wheel 392. The ratchet wheel 392 is attached to a sprocket 396 such that the wheel 392 is not rotatable relative to the sprocket 396. When the ratchet wheel 392 is rotated, the sprocket 396 is rotated, so that an electronic-component carrier tape is fed forward.

A projection 398 projects from the rotary plate 378 in a plane in which the plate 378 extends. A tension coil spring 400 as a biasing device is provided between the projection 398 and the ratchet-pawl supporting plate 386. The coil spring 400 biases the supporting plate 386 in the forward direction of the rotary plate 378. The rotation of the supporting plate 386 relative to the rotary plate 378 because of the biasing force of the coil spring 400, is limited by abutment on the projection 398 of a stopper projection 402 projecting from the supporting plate 386.

A projection 406 projects from the rotary plate 378, and is fit in a recess 408 formed in the slideable portion 348 of the shutter 346. The recess 408 is wide in the tape feeding direction, and has a width which ensures that after the carrier tape is fed by one pitch thereof, the projection 406 is further movable forward by a predetermined distance.

Figure 20:
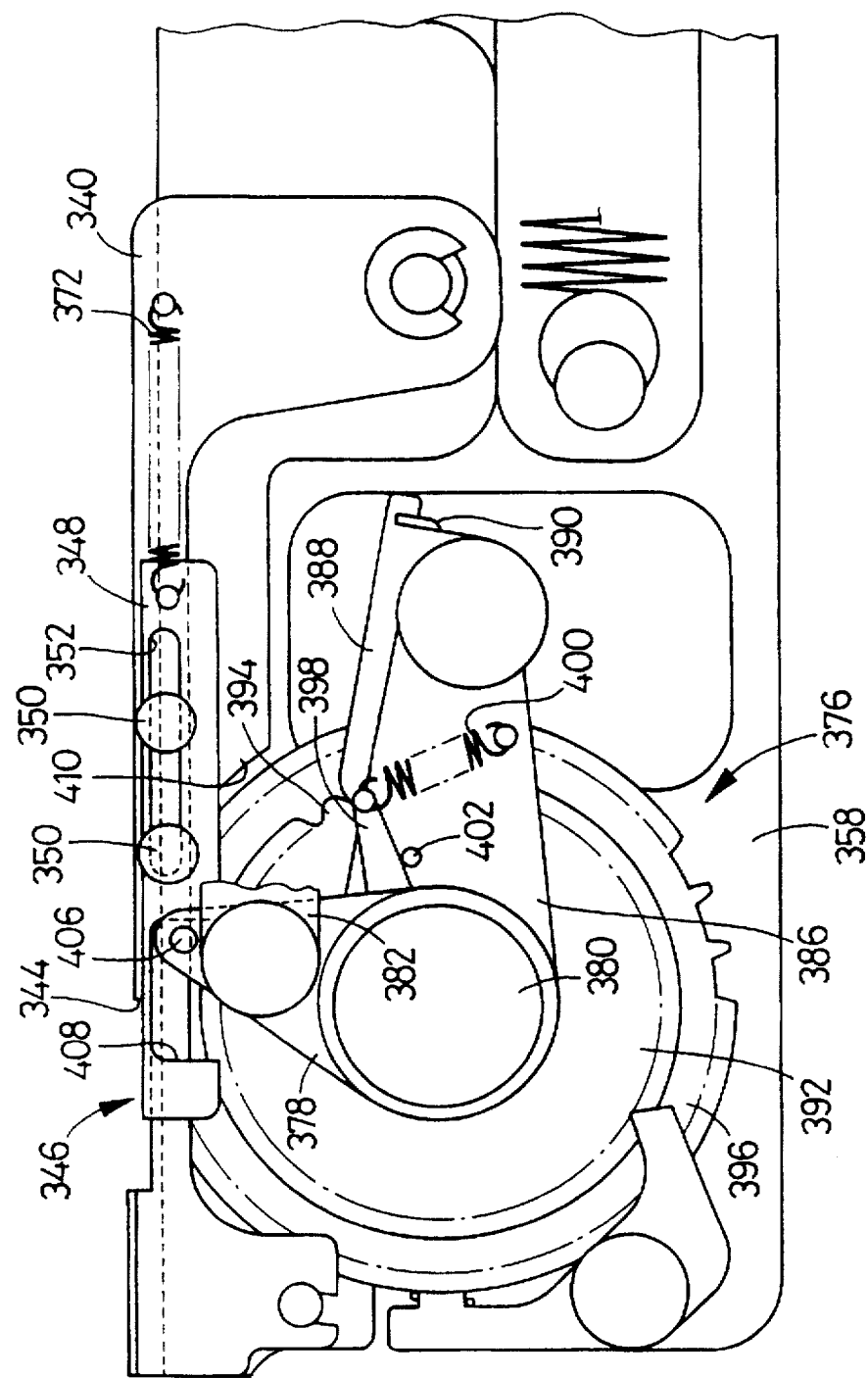
FIG. 20 is a view of a tape feeding device of the electronic-component supplying cartridge including the cover and shutter of FIG. 18, showing a state of the feeding device before a tape feeding.

As shown in FIG. 20, when the rotary plate 378 is positioned at the limit of rotation thereof in a backward direction thereof, the shutter 346 is biased by the tension coil spring 372, so that the pair of movable jumping-out-preventing portions 368 are engaged with the upstream-side end wall of the recess 344 and the groove 364 is positioned at a first position of the shutter 346 directly above an electronic-component accommodating pocket fed to the electronic-component picking-up position. In this situation, the projection 406 of the rotary plate 378 is positioned slightly away from an upstream-side end wall of the recess 408 as seen in the tape feeding direction, and the projection 398 is engaged with the stopper projection 402.

Figure 21:
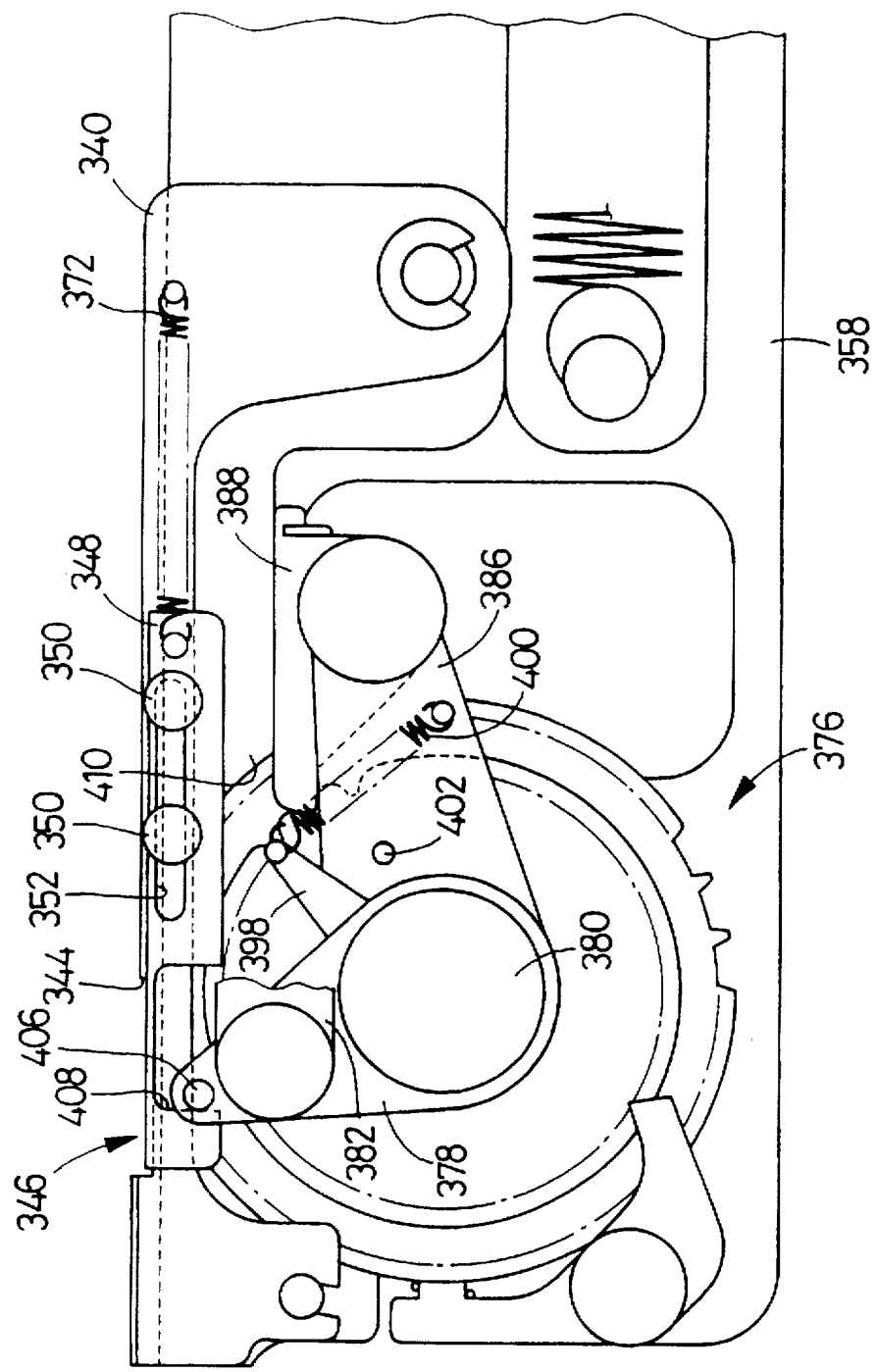
FIG. 21 is a side view of the tape feeding device of FIG. 20, showing a state of the feeding device after a feeding of a component carrier tape.

When the carrier tape is fed, the rotary plate 378 is rotated in the forward direction thereof and accordingly the ratchet-pawl supporting plate 386 is rotated together with the rotary plate 378. For a while, the projection 406 is moved within the recess 408 but does not move the shutter 346. Even after an electronic component is fed to the electronic-component picking-up position and the ratchet pawl 388 is engaged with a stopper projection 410 provided on the cartridge frame 358, the link 382 is further moved forward. As shown in FIG. 21, in the latter situation, the tension coil spring 400 is extended and only the rotary plate 378 is rotated in the forward direction thereof. Immediately thereafter, the projection 406 abuts on a downstream-side end wall of the recess 408 to start moving the shutter 346. Consequently the pair of movable jumping-out-preventing portions 368 are retracted away from the electronic component, and a component-suction nozzle is permitted to pick up the component from the component accommodating pocket of the carrier tape.

After an electronic component is fed to the electronic-component picking-up position and before the retracting movement of the shutter 346 is started, the component-suction nozzle is moved downward and, before completion of the retracting movement of the shutter 346, the nozzle holds by suction the component. This operation is ensured by a cam surface of a cam of a component-suction-nozzle elevating device 30 and a cam surface of a cam of the driving-lever rotating device 94.

In the embodiment shown in FIGS. 18–21, a part of the rotation of the rotary plate 378 resulting from the rotation of the driving lever is allotted to the feeding of the electronic-component carrier tape, and another part is allotted to the movement of the shutter 346. The ratchet wheel 392 is adapted to ensure that the part of the rotation of the rotary plate 378 leads to feeding an electronic-component carrier tape having a maximum feeding pitch.

The rotary plate 378 is rotated in the backward direction thereof after the component-suction nozzle has picked up the electronic component from the electronic-component accommodating pocket. Thus, the shutter 346 is moved to the first position thereof by being biased by the tension coil spring 372 connected to the cover 340. After the movable jumping-out-preventing portions 368 are engaged with the upstream-side end wall of the recess 344 of the cover 340, the projection 406 of the rotary plate 378 is moved away from the downstream-side end wall of the recess 408. After the projection 398 is engaged with the stopper projection 402, the ratchet-pawl supporting plate 386 is rotated in a backward direction thereof, so that the ratchet pawl 388 is moved over the teeth 394 of the ratchet wheel 392.

It emerges from the foregoing description that in the embodiment shown in FIGS. 18–21 the shutter 346 provides the movable jumping-out-preventing member and the cover 340 provides the immovable jumping-out-preventing member. The projection 406 and the recess 408 cooperate with each other to provide the movable-jumping-out-preventing-member-related transmitting device and the movable-jumping-out-preventing-member-related transmitting device cooperates with the tension coil springs 372, 400 to provide the movable-jumping-out-preventing-member moving device. The link 382 as the transmitting member, the rotary plate 378 as the rotary member as a sort of feeding member, and others cooperate with the ratchet-pawl supporting plate 386, ratchet pawl 388, ratchet wheel 392, sprocket 396, and others to provide the tape feeding device.

In the embodiment shown in FIGS. 18–21, if it is required that the distance of movement of the shutter 346 be increased, an amplifying mechanism which amplifies the motion of the rotary plate 378 and transmits the amplified motion to the shutter 346 may be provided between the rotary plate 378 and the shutter 346. More specifically described, for example, an amplifying lever is rotatably attached to the cartridge frame 358, such that one end of the lever is connected to the rotary plate 378 and the other end of the same is connected to the shutter 346. In the latter case, the amplifying lever is provided at a position where the rotary plate 378 is engaged with the amplifying lever after being rotated by a small angle following completion of the tape feeding. The rotary motion of the rotary plate 378 is amplified by a lever ratio of the amplifying lever and the amplified motion is transmitted to the shutter 346.

In each of the illustrated embodiments, the movement of the component-suction nozzle and the movement of the movable jumping-out-preventing member are carried out in such a manner that after the movable member is moved to the first position thereof, the nozzle is moved to the suction position concurrently with the retracting movement of the movable member to the second position thereof and holds by suction the electronic component before completion of the retracting movement of the movable member to the second position. However, those movements may otherwise be modified so long as the nozzle holds by suction the component before completion of the retracting movement of the movable member to the second position.

For example, it is possible that after the movable member is moved to the first position and before the movement of the movable member to the second position is started, the nozzle be moved to the suction position to hold by suction the component, or otherwise it is possible that the movement of the nozzle to the suction position be synchronized with the movement of the movable member to the first position and the nozzle contacts and holds the component immediately after completion of the movement of the movable member to the first position.

In the illustrated embodiments, the driving lever as part of the tape feeding device is provided by a rotary member which is rotatable about an axis line. However, the driving lever may otherwise be provided by a member which is movable along a straight line.

In addition, the driving-lever moving device which moves the driving lever is not limited to a device which rotates the driving lever based on the rotation of an engagement member. The engagement member may otherwise be provided by a member which is movable along a straight line. The driving lever may otherwise be provided by a member which is rotatable, or movable along a straight line, based on the linear movement of the linearly movable member.

In the illustrated embodiments, the component-suction nozzles 26 are provided on the rotatable index table 14, and the electronic-component supplying cartridges 42 are movable in a direction perpendicular to the direction of feeding of the electronic-component carrier tape 50. However, the present invention is applicable to an electronic-component supplying and picking-up apparatus which moves one of a nozzle and each cartridge in the direction of an array of cartridges and moves the other in a direction perpendicular to the direction of the array of cartridges, or an electronic-component supplying and picking-up apparatus which includes immovable cartridges and a nozzle movable relative to each cartridge to an arbitrary position on a certain plane.

In each of the illustrated embodiments, the index servomotor as a drive source of the index table 14 of the electronic-component mounting apparatus 10 also functions as a drive source of the tape feeding device. However, an exclusive servomotor may be employed as the drive source of the tape feeding device.

Alternatively, an air cylinder may be used as the drive source of the tape feeding device. In the latter case, a piston rod of the air cylinder may directly be connected to the previously-described link or rotary plate, so that the advancing and retracting movements of the piston rod result in rotating the rotary plate and thereby feeding the electronic-component carrier tape.

In the case where an exclusive drive source is employed for the tape feeding device as indicated above, a control device is employed which controls the drive source. It is preferred that the control device be essentially provided by a computer. The control device synchronizes the movement of the component-suction nozzle and the movement of the movable jumping-out-preventing member with each other. In this case, a portion of the control device which carries out the synchronized movements provides the synchronizing device.

In addition, the present invention is applicable to an electronic-component supplying cartridge which supplies electronic components each with no lead, or an electronic-component carrier tape which includes a pair of side portions and a continuous electronic-component accommodating portion which projects downward from the pair of side portions and has a number of electronic-component accommodating pockets formed at a predetermined pitch.

Moreover, the present invention may be embodied by changing one or more of the structural elements of each of the illustrated embodiments with one or more of those of another or others of the same.

Otherwise, the present invention may be embodied with various changes and improvements that may occur to those skilled in the art without departing from the scope of the invention defined in the appended claims.

We claim:

1. An electronic-component supplying cartridge, comprising:

a cartridge frame;

a tape feeding device which is mounted on the cartridge frame and which feeds an electronic-component carrier tape having a plurality of electronic-component accommodating pockets at a predetermined pitch, in a direction of an array of the pockets, said tape feeding device intermittently feeding said carrier tape at said pitch in said direction so that said pockets are positioned one by one at an electronic-component picking-up position;

a movable jumping-out-preventing member which is provided on the cartridge frame such that the movable jumping-out-preventing member is movable relative to the cartridge frame in a direction parallel to the tape feeding direction and which has a pair of movable jumping-out-preventing surfaces for preventing at least one first electronic component from jumping out of at least one first pocket of the pockets of the carrier tape;

an immovable jumping-out-preventing member which is provided on the cartridge frame such that the immovable jumping-out-preventing member is immovable relative to the cartridge frame, on an upstream side of the movable jumping-out-preventing member in the tape feeding direction, and which has an immovable jumping-out-preventing surface for preventing at least one second electronic component from jumping out of at least one second pocket of the pockets of the carrier tape, the immovable jumping-out-preventing surface being substantially flush with the pair of movable jumping-out-preventing surfaces; and a movable-jumping-out-preventing-member moving device which moves the movable jumping-out-preventing member to an upstream-side position thereof where the movable jumping-out-preventing surfaces are positioned adjacent to, and on a downstream side of, the immovable jumping-out-preventing surface in the tape feeding direction, and to a downstream-side position thereof remote from the upstream-side position in the tape feeding direction, when the movable jumping-out-preventing member is positioned at a first position thereof as one of the upstream-side and downstream-side positions, the movable jumping-out-preventing member being opposed to one of said at least one first pocket fed to the electronic-component picking-up position, so as to prevent one of said at least one first electronic component from jumping out of said one of said at least one first pocket, when the movable jumping-out-preventing member is positioned at a second position thereof as the other of the upstream-side and downstream-side positions, the movable jumping-out-preventing member being remote from the first position in the tape feeding direction, the movable jumping-out preventing member having a groove which extends in the tape feeding direction and which opens, at one end thereof, toward the electronic-component picking-up position when the movable jumping-out-preventing member is positioned at the second position, and said pair of movable jumping-out-preventing surfaces which extend in the tape feeding direction on both sides of the groove, respectively.

2. The electronic-component supplying cartridge as set forth in claim 1, wherein the movable-jumping-out-preventing-member moving device comprises moving means for moving the movable jumping-out-preventing member to the first position as the upstream-side position, and to the second position as the downstream-side position.

3. The electronic-component supplying cartridge as set forth in claim 2, wherein said moving means comprises means for moving the movable jumping-out-preventing member to the upstream-side position where the movable jumping-out-preventing member contacts a downstream-side end of the immovable jumping-out-preventing member in the tape feeding direction and the movable jumping-out-preventing surfaces and the immovable jumping-out-preventing surface cooperate with each other to provide a substantially continuous surface.

4. The electronic-component supplying cartridge as set forth in claim 1, wherein the movable-jumping-out-preventing-member moving device moves the movable jumping-out-preventing member to the first position as the downstream-side position, and to the second position as the upstream-side position, and wherein the movable jumping-out-preventing member comprises an upstream-side portion which is superposed, when the movable jumping-out-preventing member is positioned at the upstream-side position, an opposite surface of a downstream-side portion of the immovable jumping-out-preventing member which is opposite to the immovable jumping-out-preventing surface thereof, said upstream-side portion covering, when the movable jumping-out-preventing member is positioned at the downstream-side position, a space which is produced between the movable jumping-out-preventing surfaces and the immovable jumping-out-preventing surface in the tape feeding direction.

5. The electronic-component supplying cartridge as set forth in claim 4, wherein the downstream-side portion of the immovable jumping-out-preventing member includes a pair of end portions, and an intermediate thinner portion having a smaller thickness than a thickness of said end portions, in a widthwise direction thereof perpendicular to the tape feeding direction, and wherein the movable jumping-out-preventing member includes a portion which is adjacent to, and on a downstream side of, said upstream-side portion thereof and which has the groove and the pair of movable jumping-out-preventing surfaces.

6. The electronic-component supplying cartridge as set forth in claim 5, wherein the movable jumping-out-preventing member has at least one inclined surface between the pair of movable jumping-out-preventing surfaces and one of opposite surfaces of said upstream-side portion which is opposed, when the movable jumping-out preventing member is positioned at the upstream-side position, to said opposite surface of said downstream-side portion of the immovable jumping-out-preventing member, said inclined surface being inclined such that a distance between the inclined surfaces and the cartridge frame decreases in the tape feeding direction.

7. The electronic-component supplying cartridge as set forth in claim 4, wherein the movable jumping-out-preventing member includes a pair of movable jumping-out-preventing portions having the pair of movable jumping-out-preventing surfaces, respectively, and wherein the immovable jumping-out-preventing member includes a receiving recess which receives, when the movable jumping-out-preventing member is positioned at the upstream-side position, the pair of movable jumping-out-preventing portions, said upstream-side portion covering said receiving recess when the movable jumping-out-preventing member is positioned at the downstream-side position.

8. The electronic-component supplying cartridge as set forth in claim 1, wherein the immovable jumping-out-preventing member includes a cover which includes a top plate and a pair of side plates extending downward from opposite side edges of the top plate and has an inverted-U-shaped cross section and which covers the carrier tape supported on the cartridge frame and prevents the carrier tape from jumping up from the cartridge frame, the immovable jumping-out-preventing surface including a lower surface of the top plate of the cover which faces the carrier tape.

9. The electronic-component supplying cartridge as set forth in claim 8, wherein the cover has a length extending from an upstream side of the electronic-component picking-up position in the tape feeding direction, to a downstream side of the picking-up position, and has an opening formed in at least a portion thereof right above said one of said at least one first pocket fed to the picking-up position, the opening being formed through a thickness of said portion of the cover, the cover having, on a downstream side of the opening and the immovable jumping-out-preventing surface in the tape feeding direction, a carrier-tape jumping-up preventing portion for preventing the carrier tape from jumping up from the cartridge frame.

10. The electronic-component supplying cartridge as set forth in claim 9, wherein at least while the movable jumping-out-preventing member is positioned at the downstream-side position thereof, the movable jumping-out-preventing surfaces are positioned within the opening of the cover.

11. The electronic-component supplying cartridge as set forth in claim 8, wherein the movable jumping-out-preventing member includes a shutter which includes a pair of slideable portions and a connection portion connecting the slideable portions to each other and has an inverted-U-shaped cross section and which covers the cover such that the shutter is movable relative to the cover in the tape feeding direction, the connection portion of the shutter defining the groove and the pair of movable jumping-out-preventing surfaces.

12. The electronic-component supplying cartridge as set forth in claim 11, further including a shutter guiding device which includes an elongate hole which is formed in one of the pair of slideable portions of the shutter and the pair of side plates of the cover and which extends parallel to the tape feeding direction, and a guide pin which projects from the other of the pair of slideable portions and the pair of side plates and which extends through the elongate hole, the shutter guiding device guiding the movement of the shutter relative to the cover based on the relative movement of the elongate hole and the guide pin.

13. The electronic-component supplying cartridge as set forth in claim 1, wherein the movable-jumping-out-preventing-member moving device includes a portion of the tape feeding device and a movable-jumping-out-preventing-member-related transmitting device which transmits a motion of the portion of the tape feeding device to the movable jumping-out-preventing member.

14. The electronic-component supplying cartridge as set forth in claim 13, wherein the tape feeding device includes a feeding member which is provided on the cartridge frame such that the feeding member is reciprocateable in the tape feeding direction, a driving member which is movably attached to the cartridge frame, and a transmitting member which transmits the movement of the driving member to the feeding member, the driving member being driven via a driving-member moving device by an indexing-related motor, the indexing-related motor rotating an index table which supports a plurality of component-suction nozzles each for picking up electronic components from the cartridge and which is rotatable about an axis line.

15. The electronic-component supplying cartridge as set forth in claim 13, wherein the tape feeding device includes a drive source, a feeding member which is provided on the cartridge frame such that the feeding member is reciprocateable in the tape feeding direction, a feeding-member-related transmitting device which transmits a driving force of the drive source to the feeding member so as to reciprocate the feeding member forward and backward, and a selected-movement transmitting device which transmits the forward movement of the feeding member to the carrier tape and does not transmit the backward movement of the feeding member to the carrier tape, the movable-jumping-out-preventing-member moving device including the drive source, the feeding member, and the feeding-member-related transmitting device, the movable-jumping-out-preventing-member-related transmitting device including a first engagement portion which is provided on the feeding member, and a second engagement portion which is provided on the movable jumping-out preventing member and which is engageable with the first engagement portion to transmit the movement of the feeding member to the movable jumping-out preventing member.

16. The electronic-component supplying cartridge as set forth in claim 15, wherein the feeding member of the tape feeding device includes a rotary member which is provided on the cartridge frame such that the rotary member is rotatable about an axis line perpendicular to the tape feeding direction, the selected-movement transmitting device including a ratchet wheel which is provided on the cartridge frame such that the ratchet wheel is rotatable about an axis line parallel to the axis line of rotation of the rotary member, a sprocket which is attached to the ratchet wheel such that the sprocket is not rotatable relative to the ratchet wheel and which has teeth engageable with perforations formed in the carrier tape, and a ratchet pawl which is attached to the rotary member and is engageable with the teeth of the ratchet wheel.

17. The electronic-component supplying cartridge as set forth in claim 15, wherein the feeding member of the tape feeding device includes a first rotary plate which is provided on the cartridge frame such that the first rotary plate is rotatable about an axis line, the first engagement portion including one of a projection and a recess which extends in a direction perpendicular to the axis line of rotation of the first rotary plate, the second engagement portion including the other of the projection and the recess.

18. The electronic-component supplying cartridge as set forth in claim 17, wherein the feeding member of the tape feeding device further comprises:

a second rotary plate which is provided on the cartridge frame such that the second rotary plate is rotatable about the axis line of rotation of the first rotary plate; and a connecting device which connects the first and second rotary plates to each other such that the first and second rotary plates are rotatable as a unit within a first angular range and such that the first rotary plate is rotatable relative to the second rotary plate within a second angular range different from the first angular range, the movable-jumping-out-preventing-member moving device including the first rotary plate rotatable within the second angular range.

19. The electronic-component supplying cartridge as set forth in claim 17, wherein the recess has a width in a direction parallel to the tape feeding direction to ensure that the projection is moved within the recess when the feeding member is moved to feed the carrier tape, and is engaged with an end of the recess, when a feeding of the carrier tape is ended, to subsequently transmit the movement of the feeding member to the movable jumping-out preventing member.

* * * * *